United States Patent [19]
Yamashita et al.

[11] Patent Number: 5,497,124
[45] Date of Patent: Mar. 5, 1996

[54] CLASS AB PUSH-PULL DRIVE CIRCUIT, DRIVE METHOD THEREFOR AND CLASS AB ELECTRONIC CIRCUIT USING THE SAME

[75] Inventors: Kazuo Yamashita; Nobuyuki Adachi; Masatoyo Nishibe; Masahiko Egawa; Akiharu Inoue, all of Mitaka, Japan

[73] Assignee: Japan Radio Co., Ltd., Tokyo, Japan

[21] Appl. No.: 366,891

[22] Filed: Dec. 30, 1994

[30] Foreign Application Priority Data

Jan. 19, 1994 [JP] Japan .................................. 6-004181
Jun. 27, 1994 [JP] Japan .................................. 6-144539

[51] Int. Cl.$^6$ ........................................... H03F 3/26
[52] U.S. Cl. ................................. 330/267; 330/255
[58] Field of Search ......................... 330/263, 264, 330/267, 268, 255

[56] References Cited

U.S. PATENT DOCUMENTS

| | | | |
|---|---|---|---|
| 4,038,607 | 7/1977 | Schade, Jr. ........................... | 330/264 X |
| 4,757,273 | 7/1988 | Bray ...................................... | 330/256 |
| 4,879,522 | 11/1989 | Mattfeld .............................. | 330/267 X |

OTHER PUBLICATIONS

*Bipolar and MOS Analog Integrated Circuit Design* (Grebene), 1994, pp. 252–257, pp. 296–299.
"SA/SE/NE5230 Low Voltage Operational Amplifier," *Advance Information* (1985).
"Fully–Differential CMOS Current–Mode Circuits", *Proceedings of the IEEE 1991 Custom Integrated Circuits Conference* (1991), pp. 24.1.2–24.1.3.

*Primary Examiner*—Steven Mottola
*Attorney, Agent, or Firm*—Oliff & Berridge

[57] ABSTRACT

A class AB push-pull drive circuit has two NPN transistors $Q_1$, $Q_2$ and two PNP transistors $Q_3$, $Q_4$, the emitters of which are connected together. A constant voltage circuit maintains voltages between the bases of transistors $Q_1$ and $Q_3$ and between the bases of transistors $Q_2$ and $Q_4$ constant. A differential input voltage is applied across the bases of the transistors $Q_1$ and $Q_2$. The collector currents in the transistors $Q_1$, $Q_3$, $Q_2$ and $Q_4$ increase or decrease in an exponential and differential manner. When the collector currents are in their differential relationship, they are inverted and added to provide a class AB drive current and to increase the output amplitude. The symmetry can also be improved. Since any difference between signal amplification path lengths is eliminated, a differential phase between paths is less likely to be generated in the high-frequency region. Since there is no feedback or the like for class AB drive, it is difficult for any abnormal oscillation to be produced. Since the constant voltage circuits are formed by diodes, the temperature characteristics of the transistors $Q_1$ to $Q_4$ can be compensated. Furthermore, the class AB push-pull drive circuit can be driven by a relatively low voltage. The bipolar transistors $Q_1$–$Q_4$ may be replaced by FETs.

19 Claims, 22 Drawing Sheets

CLASS AB PUSH-PULL DRIVE CIRCUIT, DRIVE METHOD THEREFOR AND CLASS AB ELECTRONIC CIRCUIT USING THE SAME

BACKGROUND OF THE INVENTION

1. Field of the Invention

The present invention relates to a circuit for driving a load in a class AB push-pull manner, such as a loudspeaker drive circuit in an acoustic system, a motor drive circuit in a servo system or an output circuit in an operational amplifier, and a drive method for such a load driving circuit.

2. Description of the Prior Art

There is known such a class AB push-pull drive circuit as shown in FIG. 23, for example. The illustrated circuit comprises an NPN transistor $Q_{101}$ and a PNP transistor $Q_{102}$, the emitters of which are connected to each other. A positive supply voltage $V_{cc}$ is applied to the collector of the transistor $Q_{101}$ while a negative supply voltage $V_{ss}$ is applied to the collector of the transistor $Q_{102}$. A constant current source $Q_{103}$ is connected between the collector and base of the transistor $Q_{101}$ while a constant current source $Q_{104}$ is connected between the base and collector of the transistor $Q_{102}$. Two diodes $D_{101}$ and $D_{102}$ are further connected in series between the bases of the transistors $Q_{101}$ and $Q_{102}$. These diodes $D_{101}$ and $D_{102}$ are in a forward biased direction relative to the P-N junction between the base and emitter of the transistors $Q_{101}$ and $Q_{102}$. An external voltage $V_i$ is applied to the connecting point of the diodes $D_{101}$ and $D_{102}$ while the emitters of the transistors $Q_{101}$ and $Q_{102}$ output a drive current $i_0$ toward a load in the post-stage (not shown).

The illustrated circuit can make the drive current $i_0$ class AB, as shown in FIG. 24. More particularly, if it is assumed that the emitter voltage of the transistors $Q_{101}$ and $Q_{102}$ is $V_0$, the collector currents $i_n$ and $i_p$ of the transistors $Q_{0101}$ and $Q_{102}$ will vary relative to $V_i-V_0$ in such a manner as shown by broken line in FIG. 24. As a result, the drive current $i_o=i_n-i_p$ will vary as shown by solid line in FIG. 24.

FIG. 25 shows another layout of the class AB push-pull drive circuit. This circuit uses an N-channel FET (Field-Effect Transistor) $Q_{105}$ in place of the NPN transistor $Q_{101}$ as in the prior art shown in FIG. 23 and a P-channel FET $Q_{106}$ in place of the PNP transistor $Q_{102}$. The sources of the FET $Q_{105}$ and $Q_{106}$ are connected to each other. The connected sources output a drive current $i_0$ toward a load in the post-stage (not shown). A positive supply voltage $V_{DD}$ is applied to the drain of the FET $Q_{105}$ while a negative supply voltage $V_{ss}$ is applied to the drain of the FET $Q_{106}$. A constant current source $Q_{103}$ is connected between the gate and drain of the FET $Q_{105}$ while a constant current source $Q_{104}$ is connected between the gate and drain of the FET $Q_{106}$. Further, the circuit uses an N-channel FET $Q_{107}$ in place of the diode $D_{101}$ shown in FIG. 23 and a P-channel FET $Q_{108}$ in place of the diode $Q_{102}$. The gates and drains of the FETs $Q_{107}$ and $Q_{108}$ are externally short-circuited to one another, with the sources thereof receiving a voltage $V_i$. This circuit can also provide such characteristics as shown in FIG. 24.

However, such circuits as shown in FIGS. 23 and 25 cannot be used if the supply voltages $V_{cc}$, $V_{DD}$ or $V_{ss}$ are low. In other words, the base voltage of the transistor $Q_{101}$ or the gate voltage of the FET $Q_{105}$ cannot exceed the positive supply voltage $V_{cc}$ or $V_{DD}$. Actually, the base voltage of the transistor $Q_{101}$ or the gate voltage of the FET $Q_{105}$ will further be limited since the transistor $Q_{101}$ or the FET $Q_{105}$ has a drop in the voltage between the base and emitter or between the gate and source. Similarly, the base voltage of the transistor $Q_{102}$ or the gate voltage of the FET $Q_{106}$ cannot be lower than the negative supply voltage $V_{ss}$. There is also a drop in the voltage between the base and emitter of the transistor $Q_{102}$ or between the gate and source of the FET $Q_{106}$. In these prior arts, since the potential difference between the positive and negative supply voltages cannot be fully utilized, the amplitude of the output voltage $V_0$ is smaller than a level determined by the potential difference. In other words, these circuits of the prior art cannot be driven by a relatively low voltage source.

To overcome such problems, there has been proposed such a class AB push-pull drive circuit as shown in FIG. 26. This circuit comprises a PNP transistor $Q_{112}$ and an NPN transistor $Q_{114}$, the collectors of which are connected to each other. A positive supply voltage $V_{cc}$ is applied to the emitter of the transistor $Q_{112}$ while a negative supply voltage $V_{ss}$ is applied to the emitter of the transistor $Q_{114}$. The collectors of the transistors $Q_{112}$ and $Q_{114}$ output a drive current $i_0$ toward a load in the post-stage, with a voltage being $V_0$ at this point. If it is assumed that the collector current of the transistor $Q_{112}$ is $i_p$ and the collector current of the transistor $Q_{114}$ is in, the outputted drive current $i_0$ becomes $i_p-i_n$.

The transistors $Q_{112}$ and $Q_{114}$ are connected to PNP and NPN transistors $Q_{111}$, $Q_{113}$, respectively. An external voltage $V_i$ is applied to the base of the transistor $Q_{111}$ and also to the collector of an NPN transistor $Q_{118}$ which forms part of a differential input circuit 101. In addition to the transistor $Q_{118}$, the differential input circuit 101 comprises another NPN transistor $Q_{117}$ having its emitter connected to that of the first transistor $Q_{118}$, a constant current source $Q_{119}$ for supplying a constant current to the emitters of the transistors $Q_{117}$ and $Q_{118}$, and constant current sources $Q_{120}$ and $Q_{121}$ for supplying constant currents to the collectors of the transistors $Q_{117}$ and $Q_{118}$. The transistor $Q_{118}$ is connected in parallel to two diodes $D_{111}$ and $D_{112}$ which are connected in series to each other in the forward biased direction relative to the P-N junction between the base and emitter of the transistor $Q_{118}$. The diodes $D_{111}$ and $D_{112}$ receive a constant current from a constant current source $Q_{122}$. Thus, the voltage between the base and emitter of the transistor $Q_{118}$ is maintained constant. The base of the transistor $Q_{113}$ is connected to the collector of the transistor $Q_{117}$ which is paired with the transistor $Q_{118}$.

The base of the transistor $Q_{117}$ is connected to the collector of the PNP transistor $Q_{115}$ and also to the emitter of the PNP transistor $Q_{116}$. A positive supply voltage $V_{cc}$ is applied to the emitter of the transistor $Q_{115}$ while a negative supply voltage $V_{ss}$ is applied to the collector of the transistor $Q_{116}$. In the circuit of the prior art, therefore, the voltage between the base and emitter of the transistor $Q_{112}$ is transferred between the base and emitter of the transistor $Q_{116}$, so that the sum of the voltage between the base and emitter of the transistor $Q_{114}$ and the voltage between the base and emitter of the transistor $Q_{112}$ is applied to the base of the transistor $Q_{117}$. As described, the base of the transistor $Q_{117}$ receives a voltage relating to two P-N junctions between the diodes $D_{111}$ and $D_{112}$. The differential input circuit 101 compares the voltages relating to these diodes with the voltages between the base and emitter in the transistors $Q_{114}$ and $Q_{112}$. Thus, the current $i_0$ can be driven in class AB.

Unlike the circuit shown in FIG. 23, the circuit of FIG. 26 can be driven by a relatively low supply voltage since the amplitude range of the output voltage $V_0$ will not be affected by the voltage between the base and emitter in the transistors $Q_{112}$ and $Q_{114}$ which relate to the output. However, such a circuit of the prior art also raises other problems.

First, the circuit of FIG. 26 produces a phase difference between signals amplified by two push-pull amplification paths, since they provide a large path difference. More particularly, the circuit of FIG. 26 provides two amplification paths, a first path of the base of the transistor $Q_{111}$→the emitter thereof→the base of the transistor $Q_{112}$→the collector thereof and a second path of the base of the transistor $Q_{111}$→the emitter thereof→the base of the transistor $Q_{115}$→ the collector thereof→the base of the transistor $Q_{117}$→ the collector thereof→the base of the transistor $Q_{113}$→the emitter thereof→the base of a transistor $Q_{114}$→the collector thereof. As can be seen from FIG. 26, the difference between these two signal amplification paths is very large.

Second, the circuit of FIG. 26 includes two closed negative-feedback loops for class AB drive. These closed negative-feedback loops tend to oscillate. More particularly, these two closed negative-feedback loops are a first loop of the base of the transistor $Q_{111}$→the emitter thereof→the base of the transistor $Q_{115}$→the collector thereof→the base of the transistor $Q_{117}$→the emitter thereof→the emitter of the transistor $Q_{118}$→the collector thereof→the base of the transistor $Q_{111}$ and a second loop of the base of the transistor $Q_{113}$→the emitter thereof→the base of the transistor $Q_{116}$→ the emitter thereof→the base of the transistor $Q_{117}$→ the collector thereof→the base of the transistor $Q_{113}$. Both of these loops tend to oscillate.

SUMMARY OF THE INVENTION

It is a first object of the present invention to provide a class AB push-pull drive circuit and drive method therefor, which can increase the output amplitude thereof to perform a class AB drive to a load even if the supply voltage is relatively low. A second object of the present invention is to provide a class AB push-pull drive circuit and a drive method therefor, which can provide a reduced difference between push-pull signal amplification paths so that no phase difference between signals will be produced, for example, in a high-frequency region. A third object of the present invention is to provide a class AB push-pull drive circuit and a drive method therefor which do not require any closed negative-feedback loop for class AB drive and which can thus make the class AB drive more stable with reduced oscillation. A fourth object of the present invention is to provide a class AB push-pull drive circuit and a drive method therefor which can be made more stable by temperature-compensating the operation.

In a first aspect of the present invention, there is provided a class AB push-pull drive circuit comprising:

a) first to fourth semiconductor elements each having a supply electrode, a drive electrode and a control electrode, the first and second semiconductor elements having a first polarity and the third and fourth semiconductor elements having a second polarity, the supply electrodes of the first to fourth semiconductor elements being connected together, a current substantially equal to that of each respective supply electrode flowing through each of the drive electrodes, the current flowing in each of the drive electrodes being controlled by the corresponding one of the control electrodes;

b) a first constant voltage circuit for maintaining a constant voltage between the control electrodes of the first and third semiconductor elements;

c) a second constant voltage circuit for maintaining a constant voltage between the control electrodes of the second and fourth semiconductor elements; and d) a first output circuit for outputting a class AB drive current which is generated by inverting and adding the currents flowing in the drive electrodes of the first and third semiconductor elements.

In a second aspect of the present invention, there is provided an class AB push-pull drive circuit comprising:

a) first to fourth semiconductor elements each having a supply electrode, a drive electrode and a control electrode, the first and second semiconductor elements having a first polarity and the third and fourth semiconductor elements having a second polarity, the supply electrodes of the first to fourth semiconductor elements being connected together, a current substantially equal to that of each respective supply electrode flowing through each of the drive electrodes, the current flowing in each of the drive electrodes being controlled by the corresponding one of the control electrodes;

b) a first constant voltage circuit for maintaining a constant voltage between the control electrodes of the first and third semiconductor elements;

c) a second constant voltage circuit for maintaining a constant voltage between the control electrodes of the second and fourth semiconductor elements; and d) a second output circuit for outputting a class AB drive current which is generated by inverting and adding the currents flowing in the drive electrodes of the second and fourth semiconductor elements.

In the first and second aspects, the voltage between the control electrodes (bases or gates) of the first and third semiconductor elements is maintained constant by the first constant voltage circuit while the voltage between the control electrodes of the second and fourth semiconductor elements is maintained constant by the second constant voltage circuit. The supply electrodes (emitters or sources) of these semiconductor elements (e.g., bipolar transistors or FETs) are connected together. Therefore, the drive electrode currents (collector or drain currents) of the semiconductor elements will increase or decrease in the exponential function manner (bipolar transistor) or in the quadratic function manner (FET) relative to the voltage between the control electrodes of the first and second semiconductor elements or the voltage between the control electrodes of the third and fourth semiconductor elements. The drive electrode currents of the first and fourth semiconductor elements increases or decreases with those of the second and third semiconductor elements in the differential relationship. When the first output circuit is used to invert and add the drive electrode currents of the first and third semiconductor elements or when the second output circuit is used to invert and add the drive electrode currents of the second and fourth semiconductor elements, therefore, a class AB drive current can be provided. At this time, the circuit of the present invention will not produce any phase difference between signals in a high-frequency region, since it provides a reduced difference between signal amplification paths for class AB drive. The circuit of the present invention does not require any loop for class AB drive. Thus, the circuit can operate more stably with less abnormal oscillation.

In a third aspect of the present invention, there is provided an class AB push-pull drive circuit comprising:

a) first to fourth semiconductor elements each having a supply electrode, a drive electrode and a control electrode, the first and second semiconductor elements having a first polarity and the third and fourth semiconductor elements having a second polarity, the supply electrodes of the first to fourth semiconductor elements being connected together, a current substantially equal to that of each respective supply electrode flowing through each of the drive electrodes, the current flowing in each of the drive electrodes being controlled by the corresponding one of the control electrodes;

b) a first constant voltage circuit for maintaining a constant voltage between the control electrodes of the first and third semiconductor elements;

c) a second constant voltage circuit for maintaining a constant voltage between the control electrodes of the second and fourth semiconductor elements;

d) a first output circuit for outputting a class AB drive current which is generated by inverting and adding the currents flowing in the drive electrodes of the first and third semiconductor elements; and e) a second output circuit for outputting another class AB drive current which is generated by inverting and adding the currents flowing in the drive electrodes of the second and fourth semiconductor elements.

In the third aspect of the present invention, the first and second output circuits are both provided. Thus, the circuit can output the class AB drive currents in a differential manner. More particularly, an electronic class AB circuit for outputting the class AB drive currents in the differential manner can be realized since the first class AB drive current provided by the first and third semiconductor elements is in the differential relationship with the second class AB drive current provided by the second and fourth semiconductor elements.

According to the present invention, the first and second output circuits are formed by current mirror circuits. First and third current mirror circuits, respectively corresponding to the first and third semiconductor elements, are connected to each other such that the output currents from these semiconductor elements are inverted and added to generate a class AB drive current. Similarly, second and fourth current mirror circuits, respectively corresponding to the second and fourth class AB drive currents, are connected to each other such that the output currents from these semiconductor elements are inverted and added to generate a class AB drive current. Therefore, a load in the post-stage can be driven through an increased current by setting an increased mirror ratio in the current mirror circuits. The connections between the first and third current mirror circuits and between the second and fourth current mirror circuits can be realized by push-pull connecting the output transistors of the current mirror circuits.

The first to fourth semiconductor elements may be bipolar transistors or FETs. With bipolar transistors, the characteristics of the collector currents are of exponential function relative to inputs. The characteristics of the FET drain currents are of quadratic function relative to inputs.

Each of the first and second constant voltage circuits includes a first or second temperature characteristic compensating means. The temperature-to-voltage characteristics of the first and third semiconductor elements is compensated by the first temperature characteristic compensating means while the temperature-to-voltage characteristics of the second and fourth semiconductor elements are compensated by the second temperature characteristic compensating means. Such an arrangement can realize a class AB push-pull drive circuit which is stable relative to temperature independently of the temperature-to-voltage characteristics of each of the semiconductor elements between the control and supply electrodes.

Each of the temperature characteristic compensating means may be formed by two temperature compensating elements. More particularly, four temperature compensating elements are provided each having its temperature-to-voltage characteristics substantially equal to those of the corresponding one of the first to fourth semiconductor elements. The first temperature compensating element having its temperature-to-voltage characteristics substantially equal to those of the first semiconductor element is forwardly connected in series to the third temperature compensating element having its temperature-to-voltage characteristics substantially equal to those of the third semiconductor element. The second temperature compensating element having its temperature-to-voltage characteristics substantially equal to those of the second semiconductor element is forwardly connected in series to the fourth temperature compensating element having its temperature-to-voltage characteristics substantially equal to those of the fourth semiconductor element. Further, the series connection between the first and third temperature compensating elements is forwardly connected in parallel to the first and third semiconductor elements while the series connection between the second and fourth temperature compensating elements is forwardly connected in parallel to the second and fourth semiconductor elements. In such a manner, the temperature compensation can preferably be realized.

The temperature compensating elements may be provided by P-N junctions. More particularly, P-N junctions of the same design as those between the control and supply electrodes of the first to fourth semiconductor elements may be used as first to fourth temperature compensating elements. These P-N junctions receive a constant current from the first constant current source.

Where the first to fourth semiconductor elements are formed by bipolar transistors, the P-N junctions are also formed by bipolar transistors of the same design as those of the first to fourth semiconductor elements. By short-circuiting between the collector and base of each of the bipolar transistors, it can provide a P-N junction between the base and emitter. Alternatively, the P-N junction between the base and emitter of a bipolar transistor having the same design as those of the first to fourth semiconductor elements and driven by a biasing bipolar transistor may be used when a circuit for driving the base of the bipolar transistor is used and the base of the biasing transistor is driven by the first constant current source. Alternatively, the P-N junction between the base and emitter of a bipolar transistor having the same design as those of the first to fourth semiconductor elements and driven by a biasing bipolar transistor may be used when a circuit for driving the base of the bipolar transistor is used and the base of the biasing transistor is driven by the second constant current source. If the first to fourth semiconductor elements are formed by FETs, the temperature compensation similar to that of the bipolar transistors can be realized by short-circuiting between the gate and drain of each of the FETs and using the first constant current source. At this time, the second constant current source may be used to drive the gate of the FET. When the class AB push-pull drive circuit is formed into an integrated circuit, the temperature compensation may be further improved by utilizing the bipolar transistors or FETs since they can easily realize components of the same characteristics as those of the first to fourth semiconductor elements.

The present invention further provides three different methods for driving the class AB push-pull drive circuit which are classified depending on in which manner a differential input voltage is applied to the first to fourth semiconductor elements. More particularly, there are a first method, in which the differential input voltage is applied directly to the first and second semiconductor elements; a second method, in which the differential input voltage is applied directly to the third and fourth semiconductor elements; and a third method, in which the differential input voltage is applied to all the semiconductor elements indirectly (i.e., through parts of the first and second constant voltage circuits). All the methods can drive the class AB push-pull drive circuit very well.

The first class AB electronic circuit of the present invention includes a differential input circuit for generating a differential current on application of the differential input voltage, the differential current being then supplied to the first and second constant voltage circuits. The first and second constant voltage circuits are responsive to the differential current to execute the aforementioned function of holding the constant voltage. The second class AB electronic circuit includes first and second differential input circuits which are driven by the same constant current. Each of the first and second differential input circuits is responsive to the differential input voltage for outputting first or second differential current. The first constant voltage circuit directly or indirectly receives the first and second differential currents to execute the constant voltage holding function while the second constant voltage circuit uses the intermediate value between the positive and negative supply voltages as a reference to execute the constant voltage holding function. Thus, the load in the post-stage can be class AB driven even when a difference between the positive and negative supply voltages is relatively small or even if the supply voltage is relatively low.

DETAILED DESCRIPTION OF THE PREFERRED EMBODIMENTS

Some preferred embodiments of the present invention will now be described with reference to the drawings.

a) Arrangements of First to Third Embodiments

Figure 1:
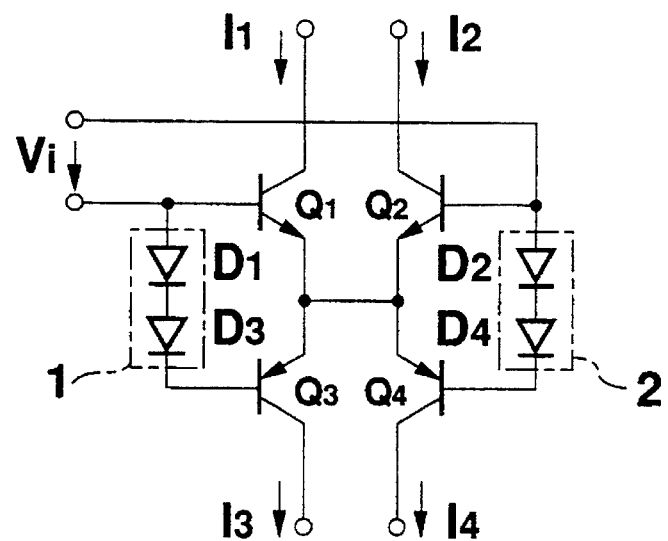
FIG. 1 is a circuit diagram showing the primary parts of a first embodiment according to the present invention.

FIG. 1 shows the primary parts of a class AB push-pull drive circuit constructed according to the first embodiment of the present invention. The first embodiment includes NPN transistors $Q_1$, $Q_2$ and PNP transistors $Q_3$, $Q_4$, the emitters of which are connected together. A constant voltage circuit 1 consisting of two diodes $D_1$ and $D_2$ is connected between the bases of the transistors $Q_1$ and $Q_3$ while a constant voltage circuit 2 consisting of two diodes $D_2$ and $D_4$ is connected between the bases of the transistors $Q_2$ and $Q_4$. Each of the diodes $D_1$ to $D_4$ is forwardly connected to the P-N junction between the base and emitter of the corresponding one of the transistors $Q_1$ to $Q_4$. A differential input voltage $V_1$ is applied across the bases of the transistors $Q_1$ and $Q_2$.

Figure 2:
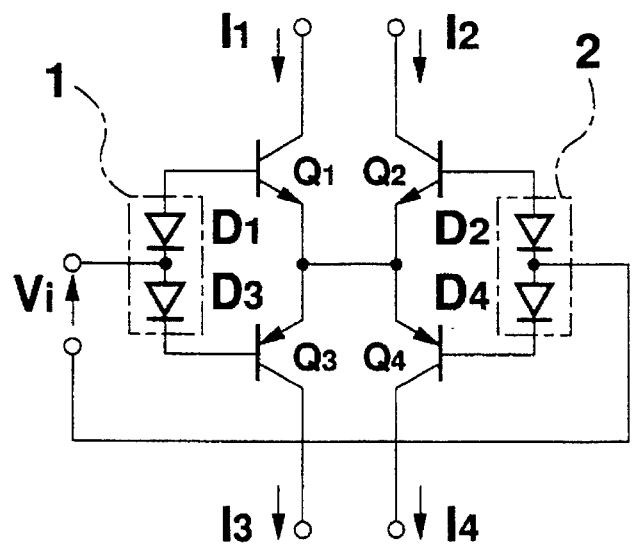
FIG. 2 is a circuit diagram showing the primary parts of a second embodiment according to the present invention.

FIG. 2 shows a class AB push-pull drive circuit constructed according to the second embodiment of the present invention. The second embodiment is different from the first embodiment in that the differential input voltage $V_i$ is applied across the connecting point between the diodes $D_1$ and $D_3$ and the connecting point between the diodes $D_2$ and $D_4$.

Figure 3:
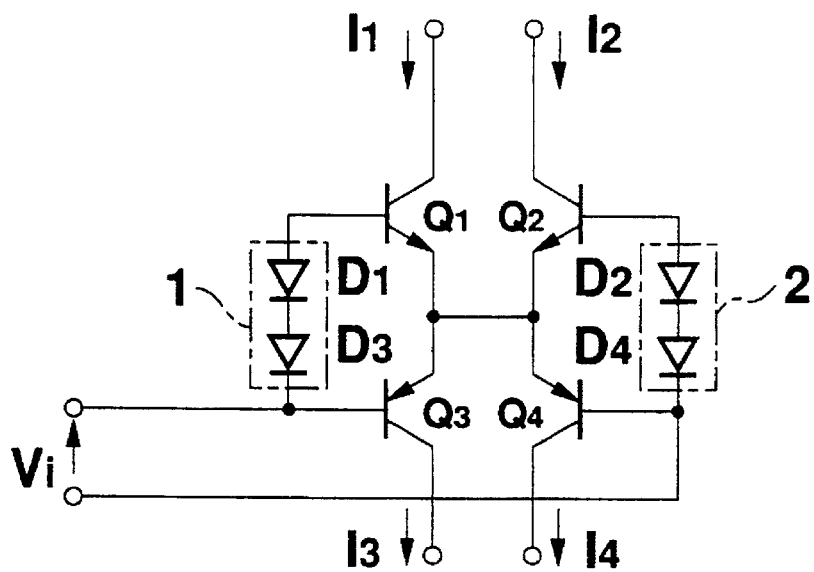
FIG. 3 is a circuit diagram showing the primary parts of a third embodiment according to the present invention.

FIG. 3 shows the primary parts of a class AB push-pull drive circuit constructed according to the third embodiment of the present invention. In the third embodiment, the differential input voltage $V_i$ is applied across the bases of the transistors $Q_3$ and $Q_4$.

In any of these embodiments, the emitters of two NPN transistors $Q_1$ and $Q_2$ and the emitters of two PNP transistors $Q_3$ and $Q_4$ are connected together. Further, the differential input voltage $V_i$ is applied to across the bases of the transistors $Q_1$ and $Q_2$ and across the bases of the transistors $Q_3$ and $Q_4$ directly or through parts of the voltage circuits 1 and 2. As will be described later, the constant voltage circuits 1 and 2 receive constant currents to maintain the voltages between the bases of the transistors $Q_1$ and $Q_3$ and between the bases of the transistors $Q_2$ and $Q_4$ constant. According to the first to third embodiments, the class AB push-pull drive circuit which can be driven by a relatively low drive voltage is realized to increase the output amplitude. The circuit also provides a reduced difference in signal paths which results in an improved symmetry and is stable in temperature without the need of any loop for class AB operation.

b) Driving Mechanism of First to Third Embodiments

The driving mechanism of the first to third embodiments will be described below:

The relationship between the base-emitter voltage $V_{be}$ and the emitter outflow current $I_{en}$ of an NPN transistor, the relationship between the emitter-base voltage $V_{eb}$ and the emitter inflow current $I_{ep}$ of a PNP transistor and the relationship between the voltage $V_d$ and the current $I_d$ of a P-N junction diode can be generally represented by the following formulas:

$$V_{be} = V_T \cdot \ln(I_{en}/I_{sn})$$

$$V_{eb} = V_T \cdot \ln(I_{ep}/I_{sp})$$

$$V_d = V_T \cdot \ln(I_d/I_{sd}) \quad (1)$$

$$V_T = k \cdot T/q \quad (2)$$

where $I_{sn}$, $I_{sp}$ and $I_{sd}$ are reverse-direction saturation currents determined by the manufacturing process of the transistors or diodes, and the size of the transistors or diodes used; k is Boltzmann's constant ($=1.38066\times10^{-23}$ (J/K)); and q is a unit charge$=1.60216\times10^{-19}$ (C). Therefore, the voltage $V_T$ depending on the absolute temperature T (K) is about 26 (mV) at room temperature and the temperature coefficients of the above voltages $V_{be}$, $V_{eb}$ and $V_d$ become equal to about $-2$ mV/° C.

To illustrate the operation of each of the embodiments in simplified manner, it is now assumed that the transistors $Q_1$ and $Q_2$ are of the same size; the transistors $Q_3$ and $Q_4$ are of the same size; and the constant voltage circuits 1 and 2 are of the same size. It is also assumed that the voltage drops of the constant voltage circuits 1 and 2 are equal to each other and also equal to $E_s$. Further, the emitter currents and base-emitter voltages of the transistors $Q_1$ to $Q_4$ are respectively represented by $I_{e1}$ to $I_{e4}$ and $V_{be1}$ to $B_{be4}$ and the emitter current when the differential input voltage $V_i$ is equal to zero is represented by $I_{e0}$. A formula (3) obtained when the aforementioned formula (1) is applied to the transistors $Q_1$ and $Q_2$, a formula (4) obtained when the aforementioned formula (1) is applied to the transistors $Q_3$ and $Q_4$, a formula (5) obtained when the aforementioned formula (1) is applied the transistors $Q_1$ and $Q_3$ and a formula (6) obtained when the aforementioned formula (1) is applied to the transistors $Q_1$ and $Q_3$, when the differential input voltage $V_i$ is equal to zero, are as follows:

$$\begin{aligned}
V_i &= V_{be1} - V_{be2} \quad (3)\\
&= V_T \cdot \ln(I_{e1}/I_{sn}) - V_T \cdot \ln(I_{e2}/I_{sn})\\
&= V_T \cdot \ln(I_{e1}/I_{e2})
\end{aligned}$$

$$\begin{aligned}
V_i &= (E_s + V_{be4}) - (E_s + V_{be3}) \quad (4)\\
&= V_T \cdot \ln(I_{e4}/I_{sp}) - V_T \cdot \ln(I_{e3}/I_{sp})\\
&= V_T \cdot \ln(I_{e4}/I_{e3})
\end{aligned}$$

$$\begin{aligned}
E_s &= V_{be1} + V_{be3} \quad (5)\\
&= V_T \cdot \ln(I_{e1}/I_{sn}) + V_T \cdot \ln(I_{e3}/I_{sp})\\
&= V_T \cdot \ln\{(I_{e1} \cdot I_{e3})/(I_{sn} \cdot I_{sp})\}
\end{aligned}$$

$$\begin{aligned}
E_s &= V_{be1} + V_{be3} \quad (6)\\
&= V_T \cdot \ln(I_{e0}/I_{sn}) + V_T \cdot \ln(I_{e0}/I_{sp})\\
&= V_T \cdot \ln\{(I_{e0} \cdot I_{e0})/(I_{sn} \cdot I_{sp})\}
\end{aligned}$$

Since the emitters of the transistors $Q_1$ to $Q_4$ are connected together, the following formula is established:

$$I_{e1} + I_{e2} = I_{e3} + I_{e4} \quad (7)$$

A formula (8) obtained by comparing the formulas (3) and (4), a formula (9) obtained by the comparison result of the formulas (5) and (6) and by the formula (8), and a formula (10) obtained by comparing the formulas (7) and (8), are as $$I_{e1}/I_{e2} = I_{e4}/I_{e3} \quad (8)$$

$$I_{e1} \cdot E_{e3} = I_{e2} \cdot I_{e4} = I_{e0}^2 \quad (9)$$

$$I_{e1} = I_{e4} \cdot E_{e2} = I_{e3} \quad (10)$$

By modifying the formulas (3), (4), (9) and (10), the following formulas (11) to (13) are obtained:

$$\begin{aligned}
V_i &= V_T \cdot \ln(I_{e1} \cdot I_{e4}/I_{e0}^2) \quad (11)\\
&= V_T \cdot \ln(I_{e0}^2/I_{e2} \cdot I_{e3})\\
&= 2 \cdot V_T \cdot \ln(I_{e1}/I_{e0})\\
&= 2 \cdot V_T \cdot \ln(I_{e4}/I_{e0})\\
&= 2 \cdot V_T \cdot \ln(I_{e0}/I_{e2})\\
&= 2 \cdot V_T \cdot \ln(I_{e0}/I_{e3})
\end{aligned}$$

$$I_{e1} = I_{e4} = I_{e0} \cdot \exp(V_i/V_T) \quad (12)$$

$$I_{e2} = I_{e3} = I_{e0} \cdot \exp(-V_i/V_T) \quad (13)$$

Figure 4:
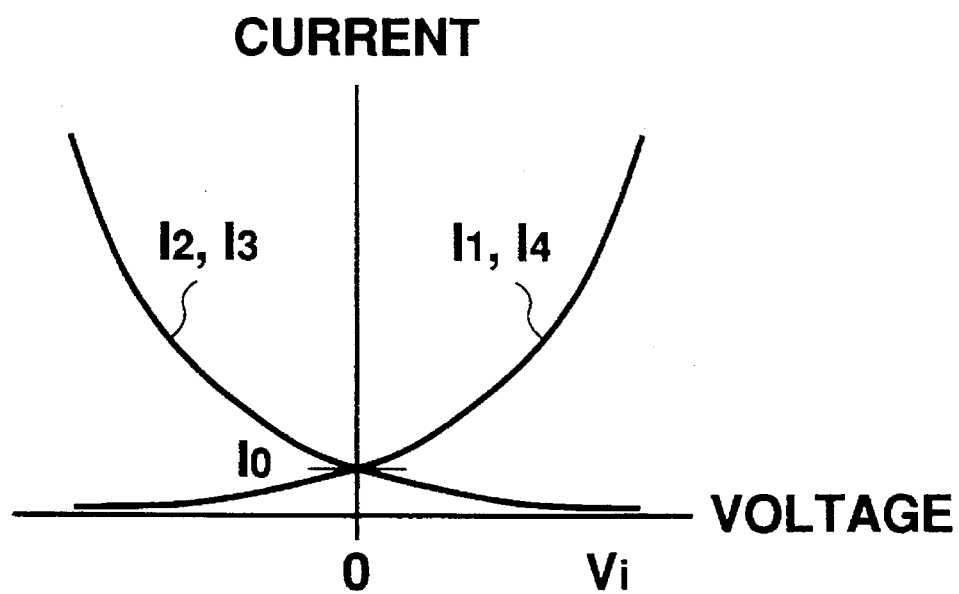
FIG. 4 is a view showing the characteristics of collector current where $I_{e01}=I_{e02}$.

Thus, the emitter current $E_{e1}$ of the transistor $Q_1$ becomes equal to the emitter current $I_{e4}$ of the transistor $Q_4$ while the emitter current $I_{e2}$ of the transistor $Q_2$ becomes equal to the emitter current $I_{e3}$ of the transistor $Q_3$. The emitter currents $E_{e1}$, $I_{e4}$ and $I_{e2}$, $I_{e3}$ exponentially increase or decrease relative to the differential input voltage $V_i$, the former $E_{e1}$, $I_{e4}$ and latter $I_{e2}$, $I_{e3}$ being in differential relationship to each other. In addition, as is well known, the emitter current of a transistor is substantially equal to the collector current of the same. Therefore, the characteristics of the collector currents $I_1$ to $I_4$ of the respective transistors $Q_1$ to $Q_4$ in each of the aforementioned embodiments relative to the differential input voltage $V_i$ are as shown in FIG. 4. As will be apparent therefrom, differential currents between the currents $I_1$ and $I_3$ and between the currents $I_2$ and $I_4$ become class AB currents.

When an output circuit for inverting and adding the currents is used with the circuits shown in FIGS. 1 to 3, a load supplied with the currents through the output circuit can be driven as in class AB. Even where a plurality of signal amplification paths are generated, a difference between the paths can be eliminated. Therefore, any phase difference between signals in the high-frequency region can be prevented. Further, it is difficult any abnormal oscillation to be created, since the circuit does not require a loop for class AB drive. In addition, the class AB push-pull drive circuit will be more stable in temperature by compensating the temperature characteristics of the P-N junction between the base and emitter of each of the transistors $Q_1$ to $Q_4$ through the diodes $D_1$ to $D_4$, since the constant voltage circuits 1 and 2 are defined by the diodes $D_1$ to $D_4$.

Figure 5:
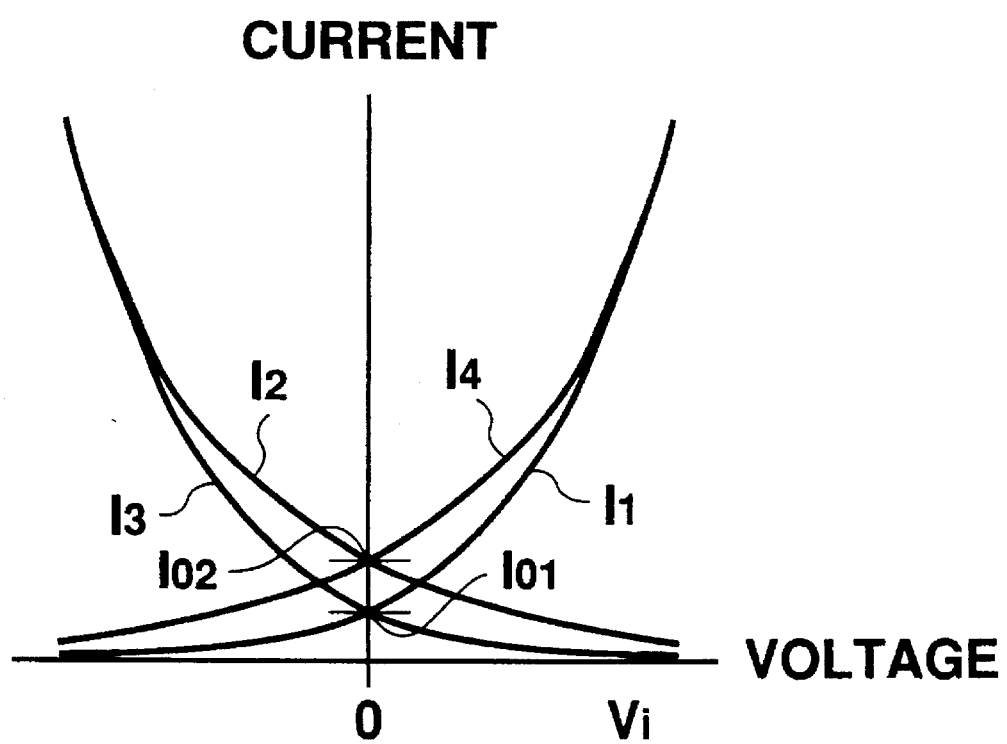
FIG. 5 is a view showing the characteristics of collector current where $I_{e01} \sim I_{e02}$.

FIG. 5 shows the characteristics of the collector currents $I_1$ to $I_4$ when the emitter current $I_{e01}$ of the transistor $Q_1$ is not equal to the emitter current $I_{e02}$ of the transistor $Q_2$ when the differential input voltage $V_i$ is equal to zero. Such characteristics as shown in FIG. 5 can be represented by the following formulas:

$$I_{e1} = I_{e01} \cdot \sqrt{\frac{I_{e01} + I_{e02} \cdot \exp(V_i/V_T)}{I_{e01} + I_{e02} \cdot \exp(-V_i/V_T)}} \quad (14)$$

$$I_{e2} = I_{e02} \cdot \sqrt{\frac{I_{e01} \cdot \exp(-V_i/V_T) - I_{e02}}{I_{e01} \cdot \exp(V_i/V_T) + I_{e02}}} \quad (15)$$

$$I_{e3} = I_{e01} \cdot \sqrt{\frac{I_{e01} + I_{e02} \cdot \exp(-V_i/V_T)}{I_{e01} + I_{e02} \cdot \exp(V_i/V_T)}} \quad (16)$$

$$I_{e4} = I_{e02} \cdot \sqrt{\frac{I_{e01} \cdot \exp(V_i/V_T) + I_{e02}}{I_{e01} \cdot \exp(-V_i/V_T) + I_{e02}}} \quad (17)$$

As will be apparent from these graph and formulas, the class AB current can be similarly obtained.

c) Arrangements of Fourth to Sixth Embodiments

Figure 6:
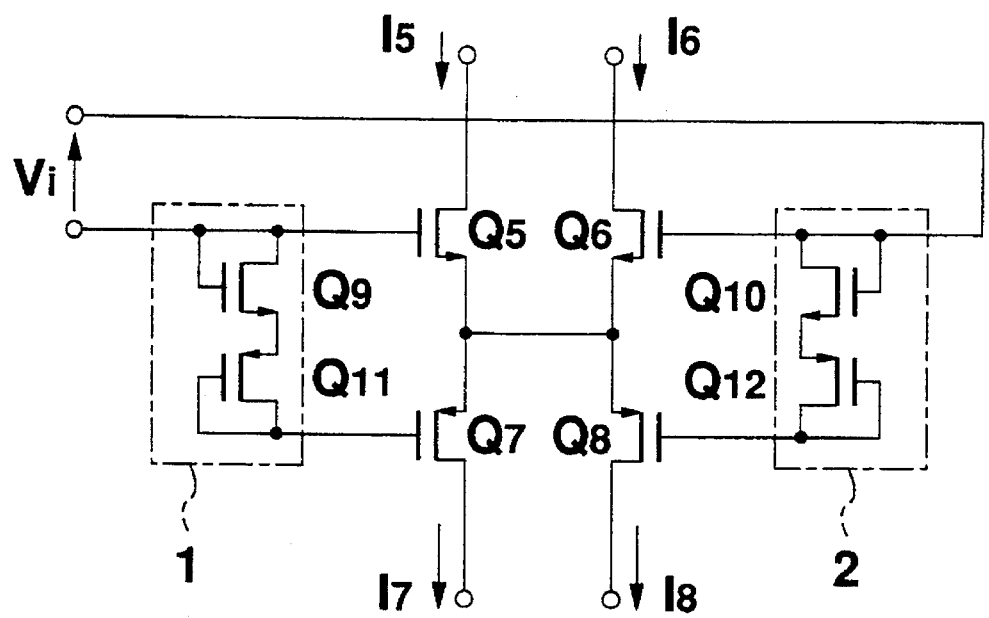
FIG. 6 is a circuit diagram showing the primary parts of a fourth embodiment according to the present invention.

FIG. 6 shows the primary parts of a class AB push-pull drive circuit constructed according to the fourth embodiment of the present invention. The fourth embodiment uses N-channel FETs $Q_5$ and $Q_6$ in place of the NPN transistors $Q_1$ and $Q_2$ in the first embodiment and also utilizes P-channel FETs $Q_7$ and $Q_8$ in place of the PNP transistors $Q_3$ and $Q_4$. The sources of the FETs $Q_5$ to $Q_8$ are connected together. The constant voltage circuit 1 is formed by N-channel FET $Q_9$ and P-channel FET $Q_{11}$, the gates and drains of which are connected together. The constant voltage circuit 2 is formed by N-channel FET $Q_{10}$ and P-channel FET $Q_{12}$, the gates and drains of which are connected together. Each of the FETs $Q_9$ to $Q_{12}$ is connected in the forward biased direction relative to the gate-source voltage of the corresponding one of the FETs $Q_5$ to $Q_8$. A differential input voltage $V_i$ is applied to between the gates of the FETs $Q_5$ and $Q_6$.

Figure 7:
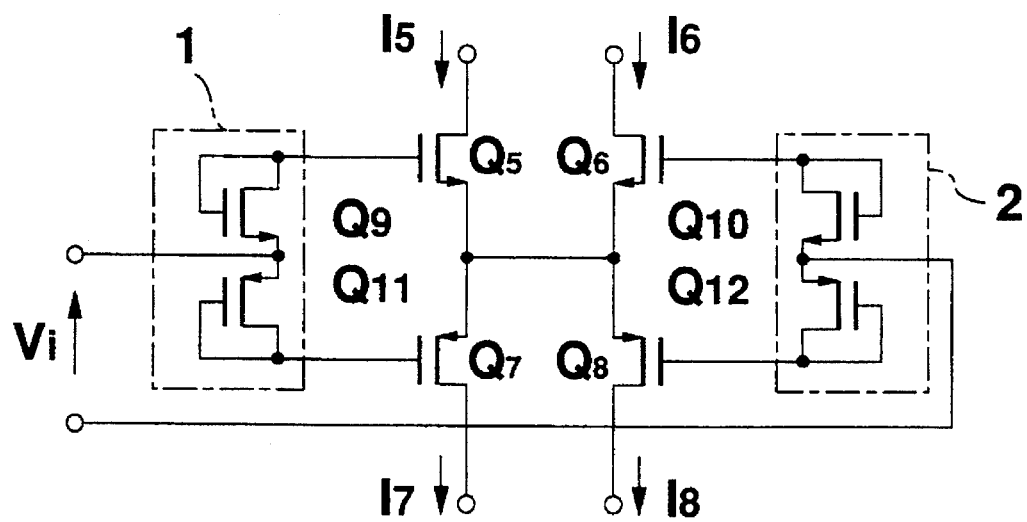
FIG. 7 is a circuit diagram showing the primary parts of a fifth embodiment according to the present invention.

FIG. 7 shows a class AB push-pull drive circuit constructed according to the fifth embodiment of the present invention. The fifth embodiment is different from the fourth embodiment in that the differential input voltage $V_i$ is applied across the connecting point of the FETs $Q_9$ and $Q_{11}$ and the connecting point of the FETs $Q_{10}$ and $Q_{12}$.

Figure 8:
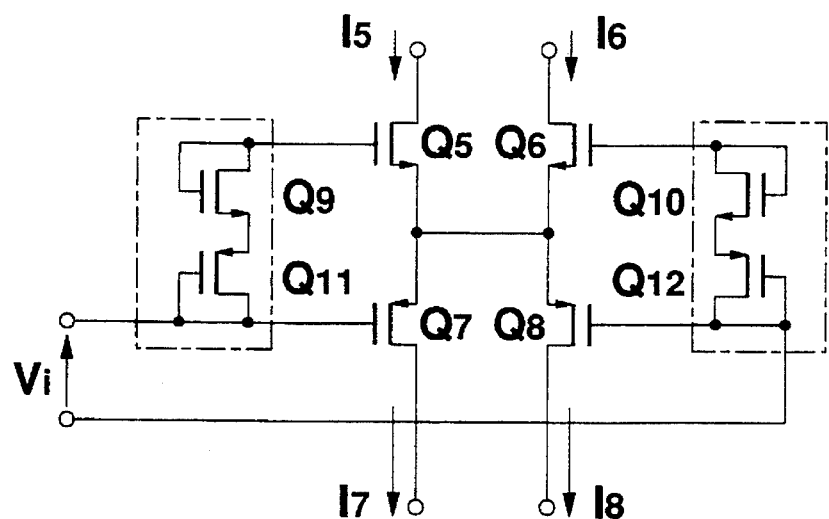
FIG. 8 is a circuit diagram showing the primary parts of a sixth embodiment according to the present invention.

FIG. 8 shows a class AB push-pull drive circuit constructed according to the sixth embodiment of the present invention. In the sixth embodiment, the differential input voltage $V_i$ is applied across the gate of the FET $Q_7$ and the gate of the FET $Q_8$.

In any of the fourth to sixth embodiments, the sources of the two N-channel FETs $Q_5$, $Q_6$ and sources of the two P-channel FETs $Q_7$, $Q_8$ are connected together. Further, the differential input voltage $V_i$ is applied directly across the gates of the FETs $Q_5$ and $Q_6$, or directly across the gates of the FETs $Q_7$ and $Q_8$, or through parts of the voltage circuits 1 and 2. As in the first to third embodiments, the constant voltage circuits 1 and 2 receive a constant current to maintain the voltage between the base of the FET $Q_5$ and the gate of the FET $Q_7$ or between the gate of the FET $Q_6$ and the gate of the FET $Q_8$ constant. According to the fourth to sixth embodiments, thus, the class AB push-pull drive circuit which can be driven by a relatively low voltage is realized to increase the output amplitude. The circuit also reduces the difference between signal path lengths, which results in improved symmetry. Further, the class AB push-pull drive circuit can be more stable in temperature. The circuit can be implemented without the need of any loop for class AB drive.

d) Driving Mechanism of Fourth to Sixth Embodiments

The driving mechanism of the fourth to sixth embodiment will now be described.

The drain currents $I_{dn}$ and $I_{pn}$ of N-channel and P-channel FETs are generally represented by the following formulas:

$$I_{dn} = -q\mu_n(C_{OX}W_1/2L_1)(V_{gs1} - V_{t1})^2 \quad (18)$$
$$= K_n V_{g1}^2$$

$$I_{pn} = q\mu_p(C_{OX}W_2/2L_2)(V_{gs2} - V_{t2})^2 \quad (19)$$
$$= K_p V_{g2}^2$$

where q=unit charge;

$\mu_n$ and $\mu_p$=mobility of electron and hole;

$C_{OX}$=thickness of gate oxide film;

$W_1$ and $W_2$=gate width;

$L_1$ and $L_2$=gate length;

$V_{gs1}$ and $V_{gs2}$=gate-source voltage;

$V_{t1}$ and $V_{t2}$=threshold voltage;

$K_n=\mu_n (C_{OX}W_1/2L_1)$;

$K_p=\mu_p (C_{OX}W_2/2L_2)$;

$V_{g1}=V_{gs1}-V_{t1}$;

$V_{g2}=V_{gs2}-V_{t2}$;

Subscript 1=N channel; and

Subscript 2=P channel.

For illustration, it is assumed that the FETs $Q_5$ and $Q_6$ are of the same size; that the FETs $Q_7$ and $Q_8$ are of the same size; and that the voltage drops of the constant voltage circuits 1 and 2 are equal to each other. It is also assumed that the absolute value of $K_n$ is equal to that of $K_p$ ($K=K_n=-K_p$). When the drain currents of the FETs $Q_5$ to $Q_8$ are respectively represented by $I_5$ to $I_8$ while the gate-source voltages thereof are respectively represented by $V_{g5}$ to $V_{g8}$, the drain currents $I_5$ to $I_8$ when the differential input voltage $V_i$ is inputted can be represented by the following formulas:

$$I_5 = K_n(V_{g1} - V_{g2})^2 = KV_i^2 \quad (20)$$

$$I_6 = -K_n(V_{g1} - V_{g2})^2 = -KV_i^2 \quad (21)$$

$$I_7 = K_p(V_{g4} - V_{g3})^2 \quad (22)$$
$$= K_p(V_{g1} - V_{g2})^2 = -KV_i^2$$

$$I_8 = -K_p(V_{g4} - V_{g3})^2 \quad (23)$$
$$= -K_p(V_{g1} - V_{g2})^2 = KV_i^2$$

Therefore, formulas (24) and (25) are obtained from the formulas (20), (23) and (21), (22), respectively.

$$I_5=I_8 \quad (24)$$

$$I_6=I_7 \quad (25)$$

Figure 9:
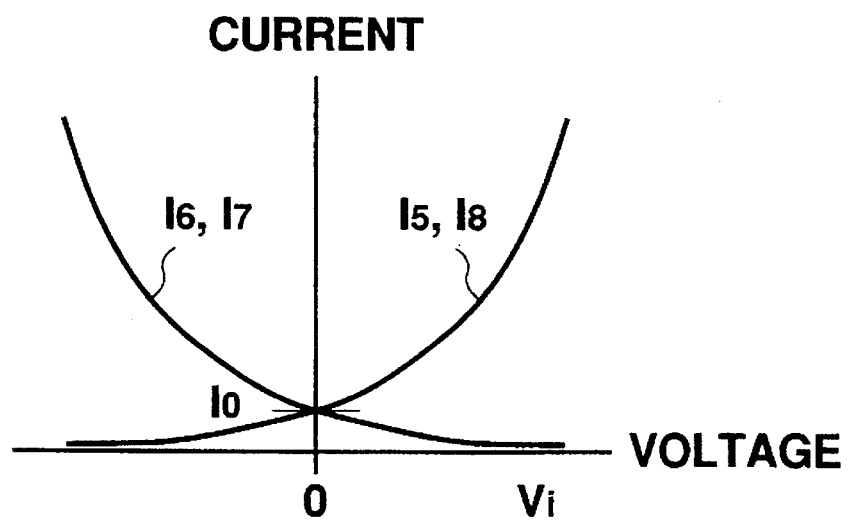
FIG. 9 is a view showing the characteristics of drain current.

As will be apparent from the formulas (24) and (25), the drain current $I_5$ of the FET $Q_5$ is equal to the drain current of the FET $Q_8$ while the drain current $I_6$ of the FET $Q_6$ is equal to the drain current $I_7$ of the FET $Q_7$. As can also be seen from the formulas (20) to (24), the drain current pairs ($I_5$, $I_6$) and ($I_7$, $I_8$) will increase or decrease relative to the differential input voltage $V_i$ in the quadratic function manner, these pairs being in differential relationship to each other. Thus, the relationship of the drain currents $I_5$–$I_8$ in the FETs $Q_5$–$Q_8$ of the fourth to sixth embodiments with the differential input voltage $V_i$ will be as shown in FIG. 9. As will be apparent from such characteristics, the differences between the currents $I_5$ and $I_7$ and between the currents $I_6$ and $I_8$ become class AB currents.

When the circuits shown in FIGS. 6–8 are used with an output circuit for inverting an adding the currents, a load supplied with the currents through the output circuit can be driven in class AB. Even where a plurality of signal amplification paths are generated, a difference between the paths can be eliminated. Therefore, any phase difference between signals in the high-frequency region can be prevented. Further, it is difficult for any abnormal oscillation to be created since the circuit does not require a loop for class AB drive. In addition, the class AB push-pull drive circuit will be more temperature stable due to compensation of the temperature characteristics between the gate and source of each of the FETs $Q_5$–$Q_8$ through the N-channel FETs $Q_9$, $Q_{10}$ and P-channel FETs $Q_{11}$, $Q_{12}$ the gates and sources of which are connected together, since the constant voltage circuit 1 and 2 are defined by the FETs $Q_9$–$Q_{12}$.

e) Forms of Constant Voltage Circuit

FIGS. 10A to 10E show five forms of the constant voltage circuit 1 or 2 which are usable in the first to third embodiments of the present invention.

Figure 10C:
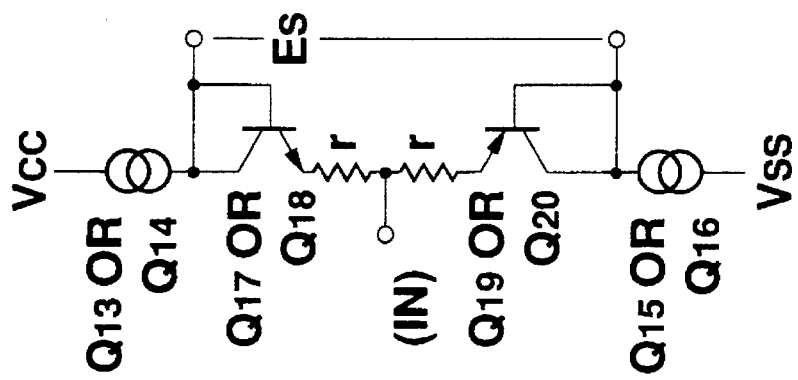
FIGS. 10A, 10B, 10C, 10D, and 10E are views showing various constant voltage circuits usable in the first to third embodiments.
Figure 10B:
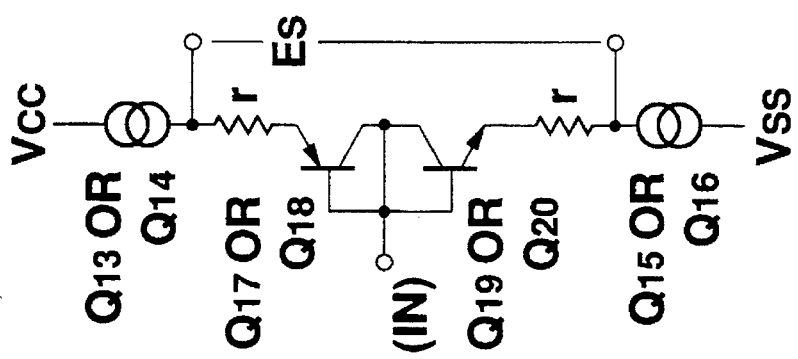
Figure 10A:
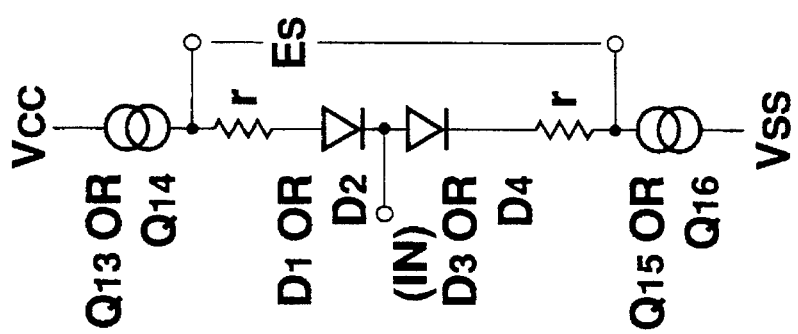

In a constant voltage circuit shown in FIG. 10A, the diode $D_1$ or $D_2$ is connected in series with the diode $D_3$ or $D_4$. These diodes are further connected in series with two resistors r and to two constant current sources ($Q_{13}$ or $Q_{14}$) and ($Q_{15}$ or $Q_{16}$). The constant current sources ($Q_{13}$ or $Q_{14}$) and ($Q_{15}$ or $Q_{16}$) provide constant currents to the diodes ($D_1$ or $D_2$) and ($D_3$ or $D_4$) to maintain a constant voltage drop $E_s$. The resistors r serve to regulate the voltage drop $E_s$.

In a constant voltage circuit shown in FIG. 10B, the diode ($D_1$ or $D_2$) is formed by a transistor ($Q_{17}$ or $Q_{18}$) which is short-circuited between the collector and base thereof. The diode ($D_3$ or $D_4$) is formed by a transistor ($Q_{19}$ or $Q_{20}$) which is short-circuited between the base and collector thereof.

In a constant voltage circuit of FIG. 10C, the transistor ($Q_{17}$ or $Q_{18}$) is of NPN type, rather than PNP type as in FIG. 10B. Similarly, the transistor ($Q_{19}$ or $Q_{20}$) is of PNP type, rather than NPN type.

Figure 10E:
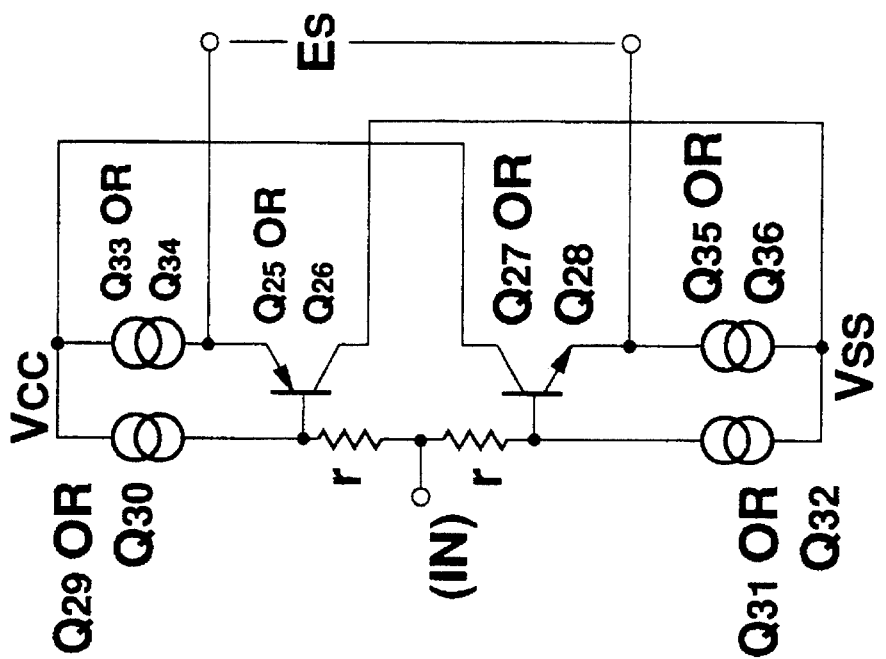
Figure 10D:
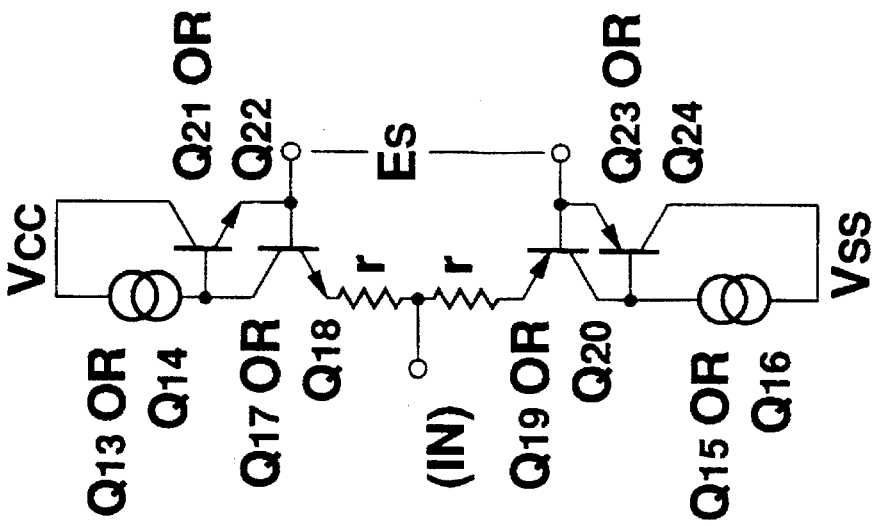

In a constant voltage circuit of FIG. 10D, the collector and base of the transistor ($Q_{17}$ or $Q_{18}$) are shunted by an NPN transistor ($Q_{21}$ or $Q_{22}$) while the collector and base of the transistor ($Q_{19}$ or $Q_{20}$) are shunted by a PNP transistor ($Q_{23}$ or $Q_{24}$).

In a constant voltage circuit shown in FIG. 10E, two resistors r are connected between the base of a transistor ($Q_{25}$ or $Q_{26}$) and the base of a transistor ($Q_{27}$ or $Q_{28}$). The connecting point between these resistors r serves as a voltage application point. The bases of the transistors ($Q_{25}$ or $Q_{26}$) and ($Q_{27}$ or $Q_{28}$) receive constant currents from two constant current sources ($Q_{29}$ or $Q_{30}$) and ($Q_{31}$ or $Q_{32}$), respectively. The emitter of the transistor ($Q_{25}$ or $Q_{26}$) receives a constant current from a constant current source ($Q_{33}$ or $Q_{34}$) while the emitter of the transistor ($Q_{27}$ or $Q_{28}$) receives a constant current from a constant current source ($Q_{35}$ or $Q_{36}$). A voltage $E_s$ appearing between the emitters of the transistors ($Q_{25}$ or $Q_{26}$) and ($Q_{27}$ or $Q_{28}$) is constant. In other words, this embodiment provides the diode ($D_1$ or $D_2$) defined by the transistor ($Q_{25}$ or $Q_{26}$) and the upper resistor r and the diode ($D_3$ or $D_4$) formed by the transistor ($Q_{27}$ or $Q_{28}$) and the lower resistor r.

Figure 11C:
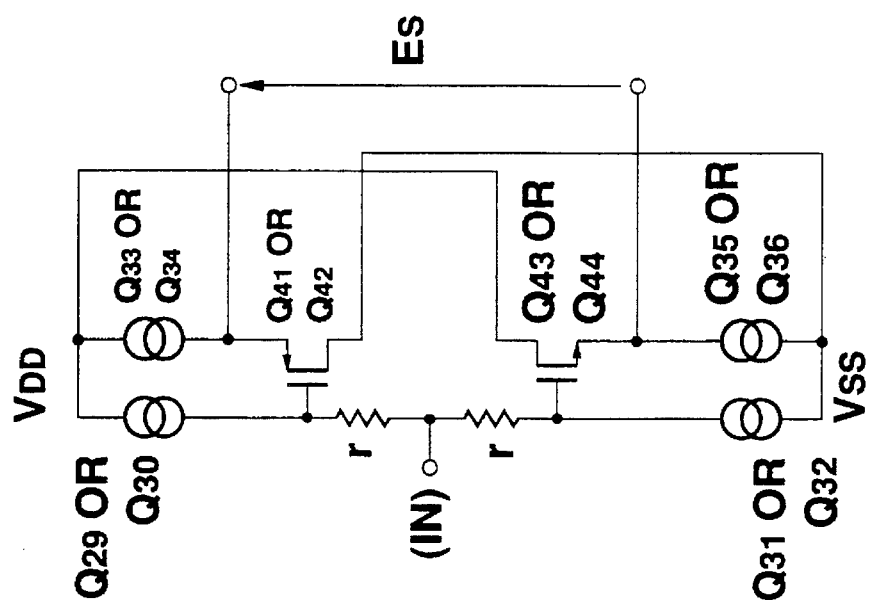
FIGS. 11A, 11B, and 11C are views showing various constant voltage circuits usable in the first to third embodiments.
Figure 11B:
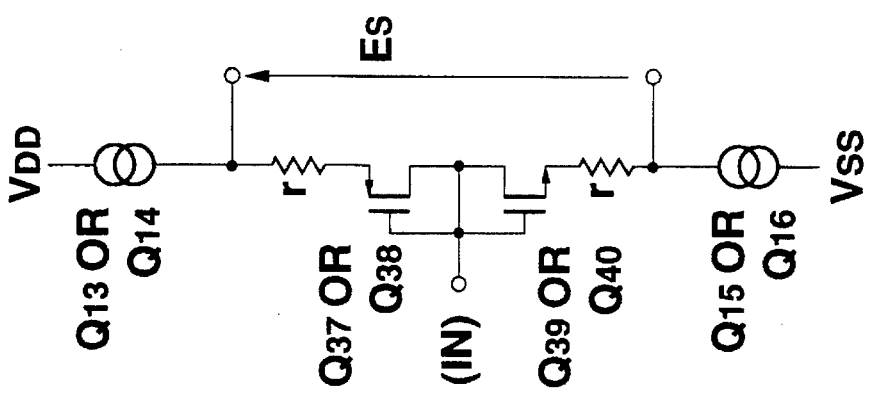
Figure 11A:
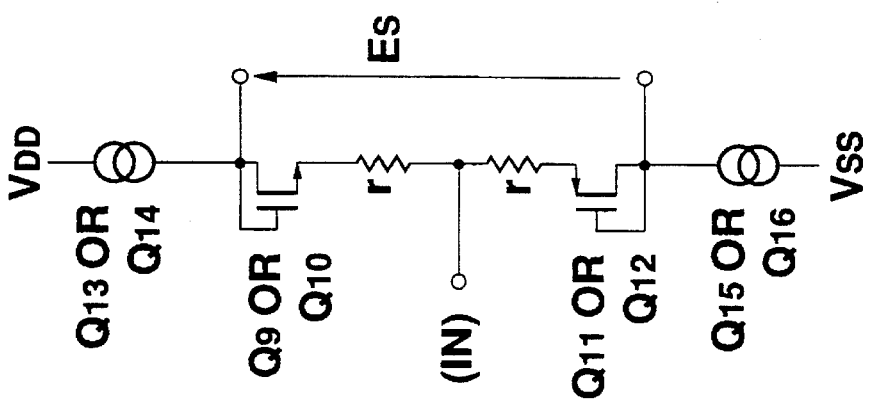

FIGS. 11A–11C show three different forms of the constant voltage circuit 1 or 2 which are usable in the fourth to sixth embodiments of the present invention.

In a constant voltage circuit shown in FIG. 11A, an N-channel FET ($Q_9$ or $Q_{10}$) is connected in series with a P-channel FET ($Q_{11}$ or $Q_{12}$). These FETs are further connected in series with two resistors r and two constant current sources ($Q_{13}$ or $Q_{14}$) and ($Q_{15}$ or $Q_{16}$). The constant current sources ($Q_{13}$ or $Q_{14}$) and ($Q_{15}$ or $Q_{16}$) provide constant currents to the FETs ($Q_9$ or $Q_{10}$) and ($Q_{11}$ or $Q_{12}$) to maintain the illustrated constant voltage drop $E_s$. The resistors r serve to regulate the voltage drop $E_s$.

A constant voltage circuit shown in FIG. 11B utilizes a P-channel FET ($Q_{37}$ or $Q_{38}$) in place of the N-channel FET ($Q_9$ or $Q_{10}$) and an N-channel FET ($Q_{39}$ or $Q_{40}$) in place of the P-channel FET ($Q_{11}$ or $Q_{12}$).

In a constant voltage circuit of FIG. 11C, two resistors r are connected between the gates of FETs ($Q_{41}$ or $Q_{42}$) and ($Q_{43}$ or $Q_{44}$), the connecting point between these resistors being a voltage application point. The gates of the FETs ($Q_{41}$ or $Q_{42}$) and ($Q_{43}$ or $Q_{44}$) receive constant currents from two constant current sources ($Q_{29}$ or $Q_{30}$) and ($Q_{31}$ or $Q_{32}$). The source of the FET ($Q_{41}$ or $Q_{42}$) is supplied with a constant current from a constant current source ($Q_{33}$ or $Q_{34}$) while the source of the FET ($Q_{43}$ or $Q_{44}$) is supplied with a constant current from a constant current source ($Q_{35}$ or $Q_{36}$). Therefore, a constant voltage $E_s$ will appear between the sources of the FETs ($Q_{41}$ or $Q_{42}$) and ($Q_{43}$ or $Q_{44}$).

f) Applied Circuit Examples

Figure 12:
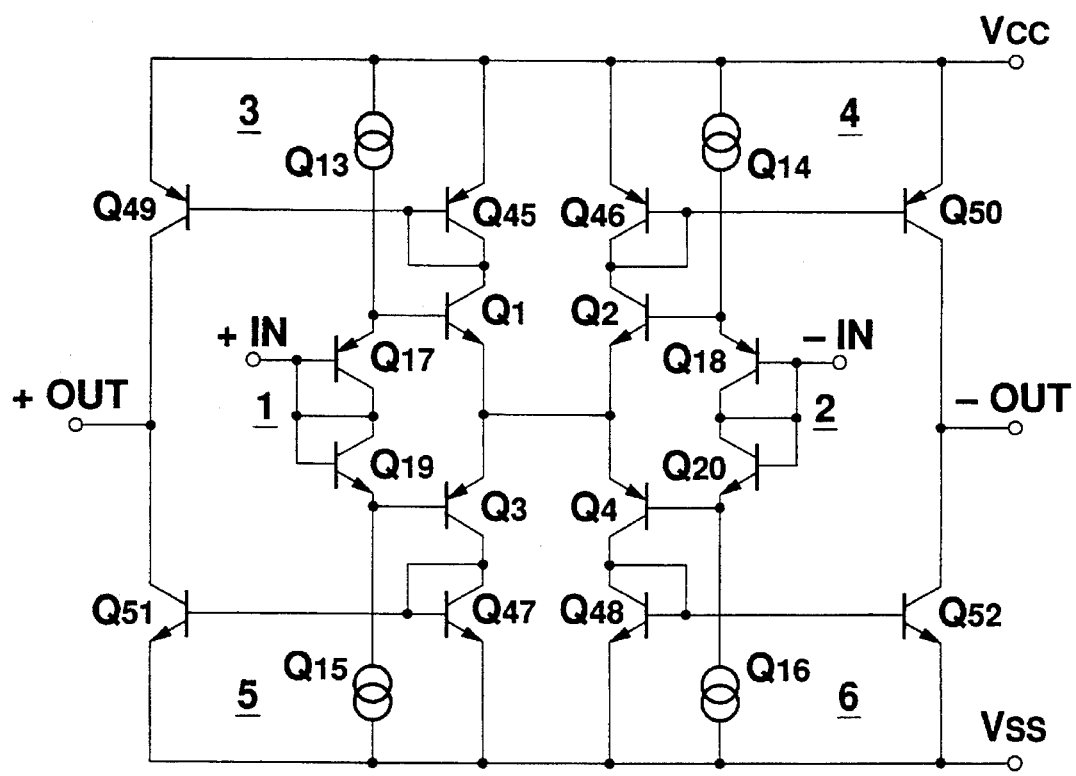
FIG. 12 is a circuit diagram of a class AB differential output circuit formed by using the circuit relating to the second embodiment of the present invention.

FIG. 12 shows a class AB output circuit modified from the second embodiment of the present invention, the circuit having a differential output. Although the illustrated circuit includes the same constant voltage circuits 1 and 2 as in FIG. 10B, they may be replaced by those of FIG. 10A and 10C–10E.

The collectors of the transistors $Q_1$–$Q_4$ are respectively connected to the collectors and bases of transistors $Q_{45}$–$Q_{48}$ which function as input diodes of current mirror circuits 3–6. The collector of an output transistor $Q_{49}$ in the current mirror circuit 3 is connected to the collector of an output transistor $Q_{51}$ in the current mirror circuit 5. Similarly, the collector of an output transistor $Q_{50}$ in the current mirror circuit 4 is connected to the collector of an output transistor $Q_{52}$ in the current mirror circuit 6. Thus, the collectors of the transistors ($Q_{49}$, $Q_{51}$) and ($Q_{50}$, $Q_{52}$) will provide two different class AB drive currents which are in a differential relationship with each other. Such a differential relationship will be apparent from FIGS. 4 and 5.

Figure 13:
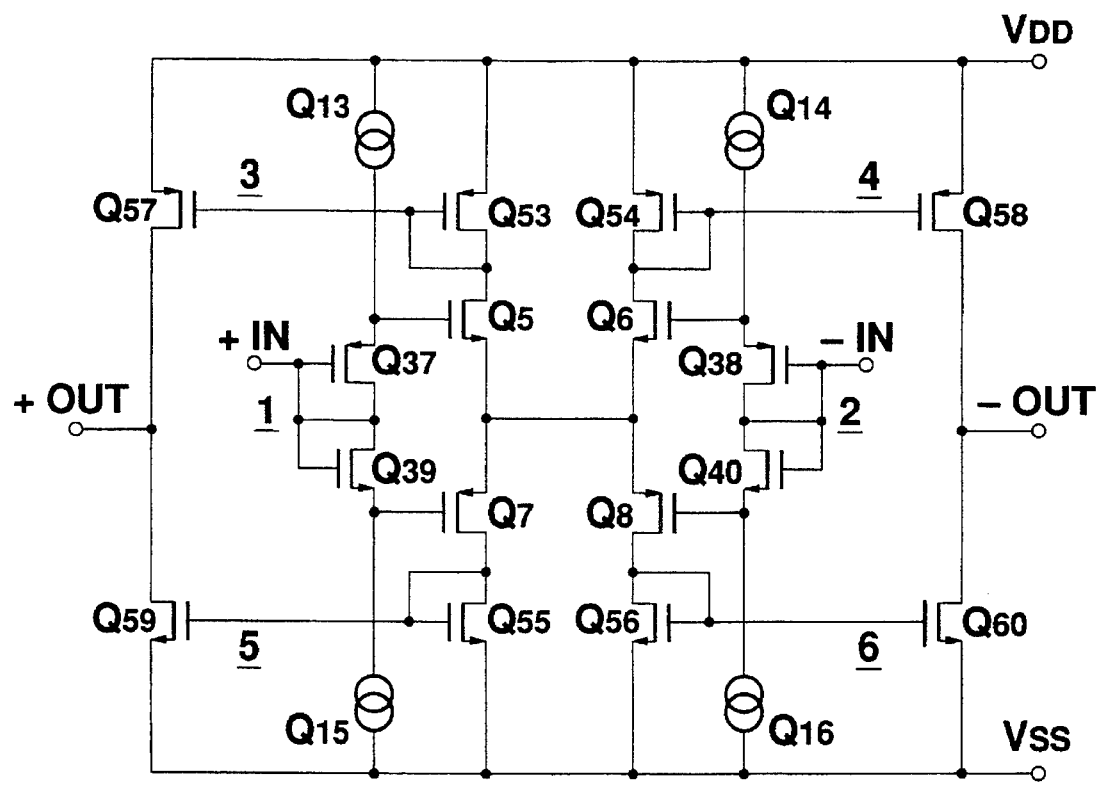
FIG. 13 is a circuit diagram of a class AB differential output circuit formed by using the circuit relating to the fifth embodiment of the present invention.

FIG. 13 shows a class AB output circuit having a differential output, which is modified from the fifth embodiment of the present invention. In this circuit, the PNP and NPN transistors ($Q_1$–$Q_4$), ($Q_{17}$–$Q_{20}$) and ($Q_{45}$–$Q_{52}$) are replaced by P- and N-channel FETs ($Q_5$–$Q_8$), ($Q_{37}$–$Q_{40}$) and ($Q_{53}$–$Q_{60}$). Although the class AB output circuit uses the same constant voltage circuits as shown in FIG. 11B, they may be replaced by those of FIGS. 11A or 11C.

Figure 14:
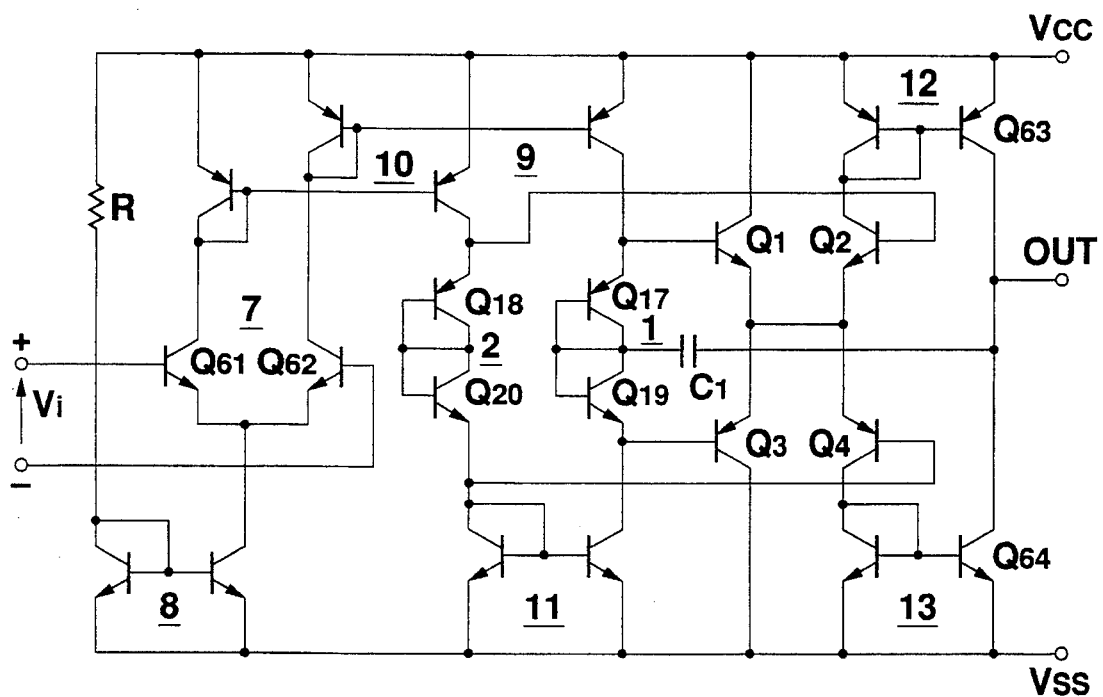
FIG. 14 is a circuit diagram showing an operational amplifier formed by using the circuit relating to the second embodiment of the present invention.

FIG. 14 shows an operational amplifier formed by the second embodiment of the present invention, which uses the same constant voltage circuits 1 and 2 as shown in FIG. 10B.

The operational amplifier comprises a differential input circuit 7 formed by two NPN transistors $Q_{61}$ and $Q_{62}$. A differential input voltage $V_i$ is externally applied to the bases of the transistors $Q_{61}$ and $Q_{62}$. A current mirror circuit 8 provides, to the emitters of the transistors $Q_{61}$ and $Q_{62}$, a constant current which is determined by the supply voltages $V_{cc}$, $V_{ss}$, a resistance R and its own mirror ratio. The emitters of the transistors $Q_{17}$ and $Q_{18}$ in the constant voltage circuits 1 and 2 receive currents corresponding to the collector currents of the transistors $Q_{62}$ and $Q_{61}$ through current mirror circuits 9 and 10, respectively. Further, the emitter current of the transistor $Q_{19}$ is maintained at the same amount as that of the transistor $Q_{20}$ by a current mirror circuit 11. The collectors of the transistors $Q_2$ and $Q_4$ are connected to current mirror circuits 12 and 13, respectively. The output transistors $Q_{63}$ and $Q_{64}$ of the current mirror circuits 12 and 13 function as output transistors in the illustrated operational amplifier. The collectors of the transistors $Q_{17}$ and $Q_{19}$ are respectively connected to those of the transistors $Q_{63}$ and $Q_{64}$ through a capacitor $C_1$.

In such an arrangement, the operational amplifier may have the aforementioned advantages with a class AB output.

Figure 15:
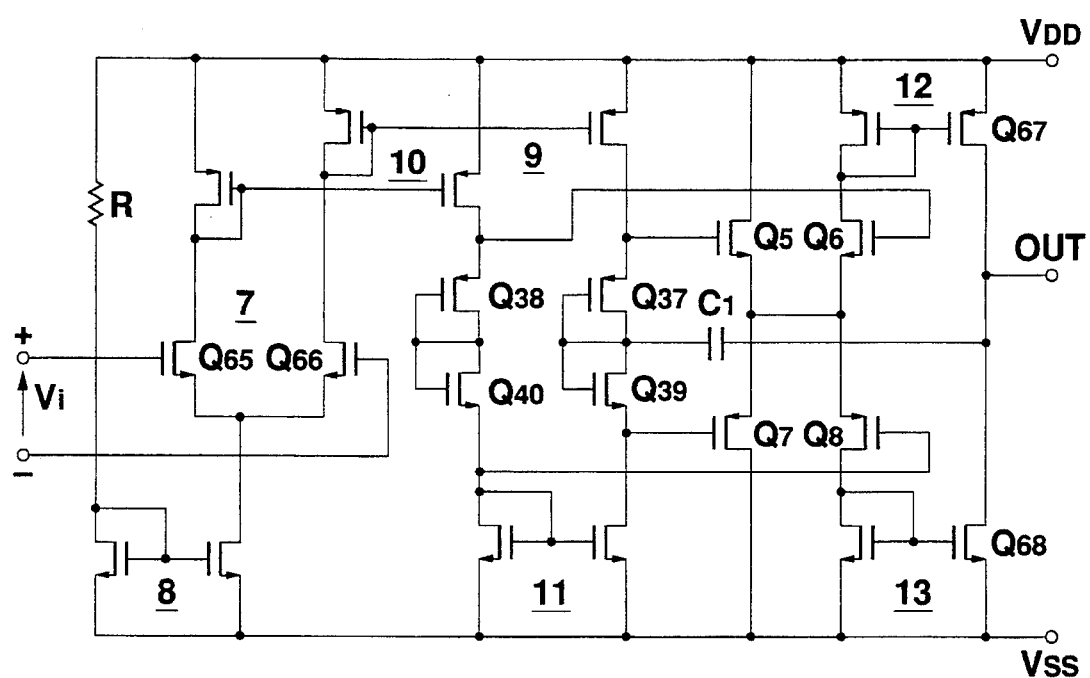
FIG. 15 is a circuit diagram showing an operational amplifier formed by using the circuit relating to the fifth embodiment of the present invention.

FIG. 15 shows another operational amplifier formed by the fifth embodiment of the present invention. This operational amplifier uses the same constant voltage circuits as shown in FIG. 11B and P- or N-channel FETs $Q_{65}$–$Q_{68}$ in place of the PNP or NPN transistors $Q_{61}$ or $Q_{64}$ as in FIG. 14.

Figure 16:
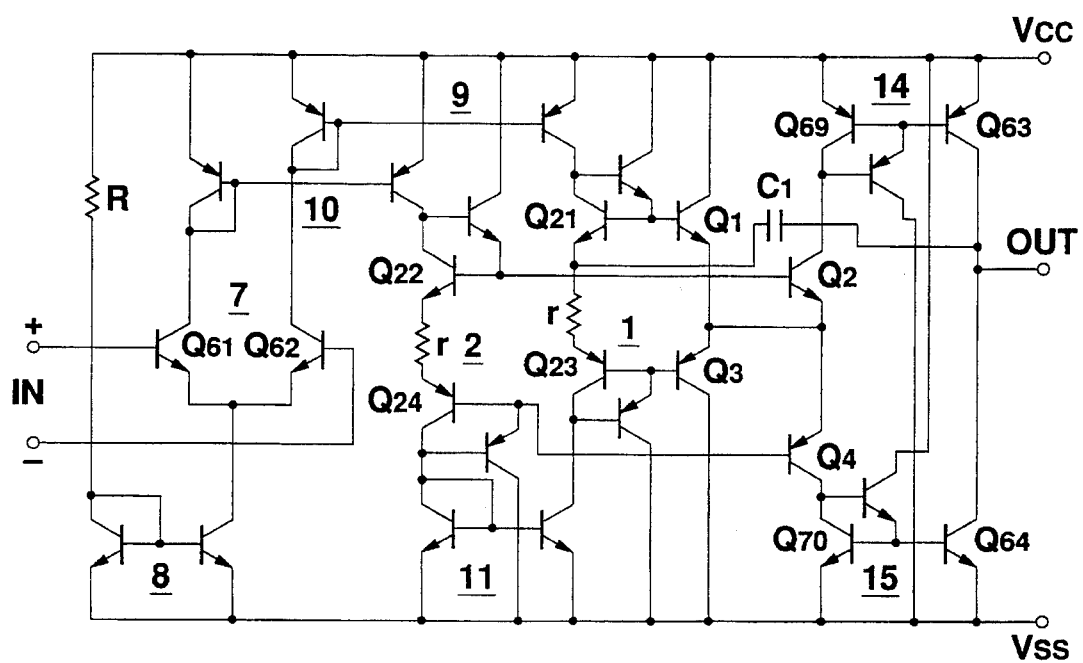
FIG. 16 is a circuit diagram showing an operational amplifier formed by using the circuit relating to the second embodiment of the present invention.

FIG. 16 shows a further operational amplifier constructed according to the second embodiment of the present invention. Unlike the circuit of FIG. 14, the operational amplifier shown in FIG. 16 utilizes the same constant voltage circuits 1 and 2 as shown in FIG. 10D. Each of current mirror circuits 14 and 15 defining an output circuit includes a PNP transistor $Q_{69}$ or $Q_{70}$ having its collector which is driven by $V_{ss}$ or $V_{cc}$. In such an arrangement, therefore, the mirror ratio in the current mirror circuits 14 and 15 can be increased. As a result, a load can be driven by a relatively large current.

Figure 17:
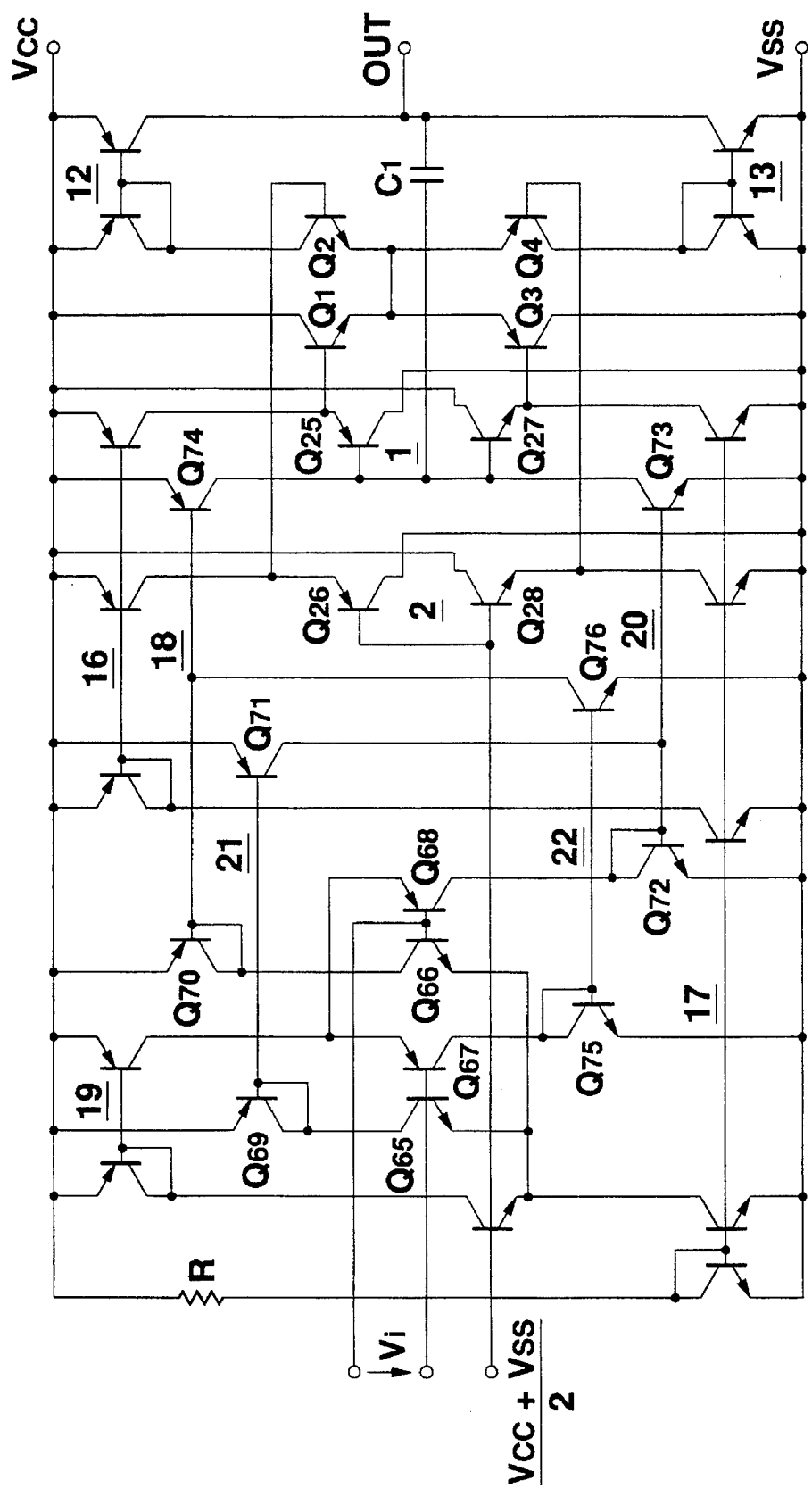
FIG. 17 is a circuit diagram showing an operational amplifier formed by using the circuit relating to the second embodiment of the present invention.

FIG. 17 shows a still further operational amplifier constructed according to the second embodiment of the present invention, in which the same constant voltage circuits 1 and 2 as in FIG. 10E are used.

The emitter of a transistor $Q_{25}$ receives a positive constant current through current mirror circuits 16 and 17, the constant current being determined by the supply voltages $V_{cc}$, $V_{ss}$, resistance R and mirror ratios. More particularly, the aforementioned constant current source $Q_{33}$ is formed by the resistor R and current mirror circuits 16, 17. Similarly, the emitter of a transistor $Q_{27}$ receives a constant current from a constant current source $Q_{35}$ which is formed by the resistor R and current mirror circuit 17. The base of the transistor $Q_{25}$ receives a constant current from a constant current source $Q_{29}$ which is defined by the resistor R and current mirror circuits 17, 18 while the base of the transistor $Q_{27}$ receives a constant current from a constant current source $Q_{31}$ which is formed by the resistor R and current mirror circuits 19, 20.

The emitter of a transistor $Q_{26}$ defining the constant voltage circuit 2 receives a constant current from a constant current source $Q_{34}$ which is defined by the resistor R and current mirror circuits 16, 17 while the emitter of a transistor $Q_{28}$ defining the constant voltage circuit 2 receives a constant current from a constant current source $Q_{36}$ which is defined by the resistor R and current mirror circuits 17. The bases of the transistors $Q_{26}$, $Q_{28}$ externally receive an intermediate voltage between the positive supply voltage $V_{cc}$ and the negative supply voltage $V_{ss}$, that is, $(V_{cc}+V_{ss})/2$.

The differential input voltage $V_i$ is applied across the bases of the transistors $Q_{65}$ and $Q_{66}$ and also across the bases of the transistors $Q_{67}$ and $Q_{68}$. The transistors $Q_{65}$ and $Q_{66}$ define a differential input circuit, with their emitters receiving a constant current from the current mirror circuit 17. The collectors of the transistors $Q_{65}$ and $Q_{66}$ are respectively connected to transistors $Q_{69}$ and $Q_{70}$ each of which is short-circuited between the base and collector thereof. The transistor $Q_{69}$ serves as an input transistor in a current mirror circuit 21 while the transistor $Q_{70}$ serves as an input transistor in a current mirror circuit 18. The collector of an output transistor $Q_{71}$ in the current mirror circuit 21 is connected to the bases of transistors $Q_{72}$ and $Q_{73}$ in the current mirror circuit 20 while the collector of the transistor $Q_{73}$ is connected to the bases of transistors $Q_{25}$ and $Q_{27}$. The collector of an output transistor $Q_{74}$ in the current mirror circuit 18 is also connected to the bases of the transistors $Q_{25}$ and $Q_{27}$.

The transistors $Q_{67}$ and $Q_{68}$ similarly define a differential input circuit. The emitters of the transistors $Q_{67}$ and $Q_{68}$ receive a constant current from a current mirror circuit 19. The collector of the transistor $Q_{67}$ is connected to an input transistor $Q_{75}$ in a current mirror circuit 22 while the collector of the transistor $Q_{68}$ is connected to an input transistor $Q_{72}$ in the current mirror circuit 20. An output transistor $Q_{76}$ of the current mirror circuit 22 is connected to the base of an output transistor $Q_{74}$ of the current mirror circuit 18 such that the output transistor $Q_{76}$ is exactly symmetrical with the transistor $Q_{71}$.

When, in such a manner, the constant voltage circuit 2 is actuated by each reference voltage $(V_{cc}+V_{ss})/2$, the base of the transistor $Q_{25}$ is driven by the output of the differential input circuit formed by the transistors $Q_{65}$ and $Q_{66}$ and the base of the transistor $Q_{25}$ is driven by the output of the differential input circuit defined by the transistors $Q_{67}$ and $Q_{68}$, and a load connected to the post-stage can be driven in the class AB drive manner even if a difference between the supply voltages $V_{cc}$ and $V_{ss}$ is relatively low, for example, equal to about 1.5 Volts.

Figure 18:
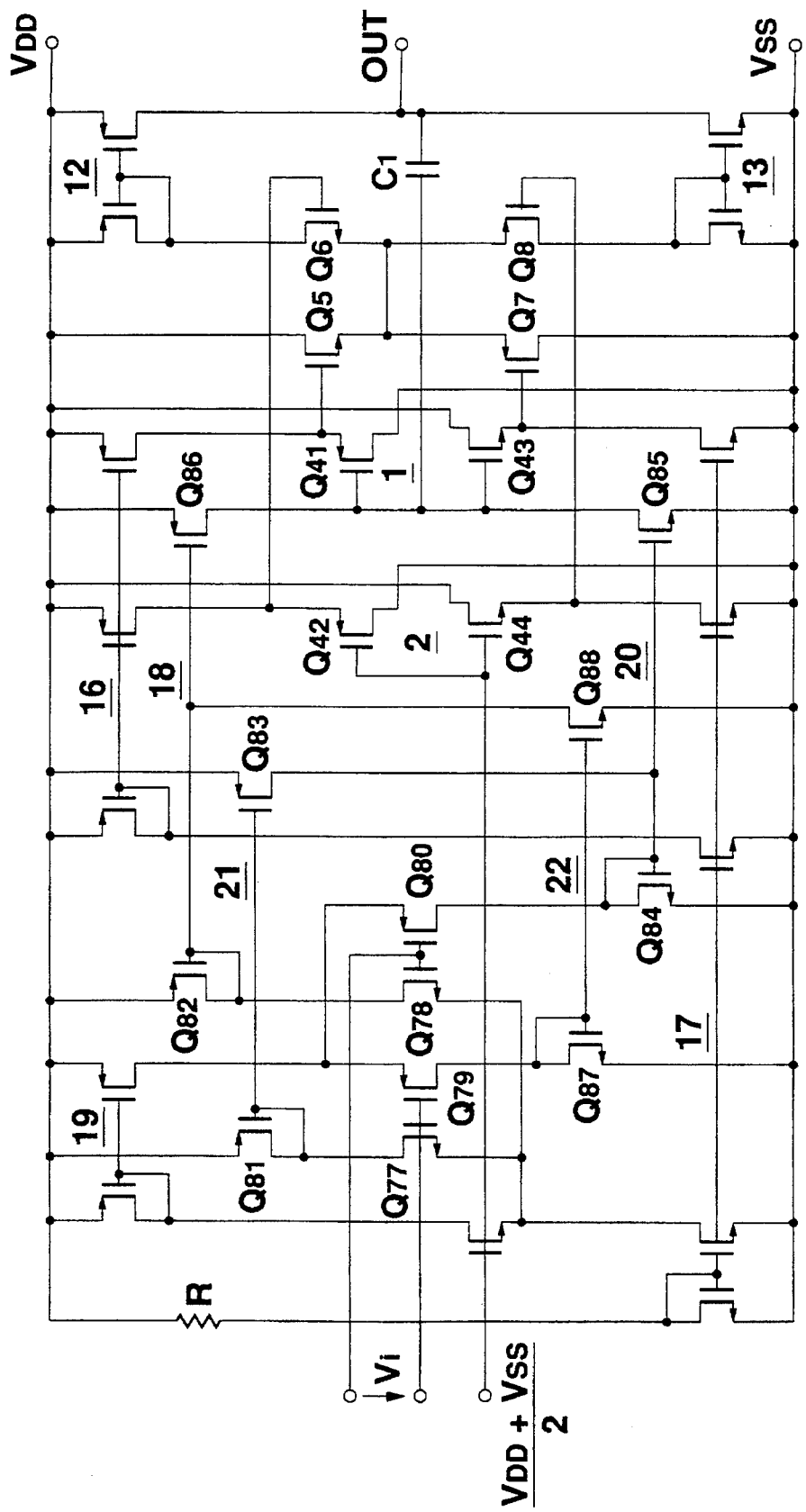
FIG. 18 is a circuit diagram showing an operational amplifier formed by using the circuit relating to the fifth embodiment of the present invention.

FIG. 18 shows a further operational amplifier constructed according to the fifth embodiment of the present invention. The operational amplifier uses the same constant voltage circuits 1 and 2 as in FIG. 11E and FETs $(Q_5$–$Q_8)$, $(Q_{41}$–$Q_{44})$ and $(Q_{77}$–$Q_{88})$ in place of the bipolar transistors $(Q_1$–$Q_4)$, $(Q_{25}$–$Q_{28})$ and $(Q_{65}$–$Q_{76})$ which are shown in FIG. 17.

g) Supplement

As described, the output circuits in the first to third embodiments are current mirror circuits formed using bipolar transistors while the output circuits in the fourth to sixth embodiments are current mirror circuits defined by FETs. However, the present invention is not limited to such output circuits.

Figure 19:
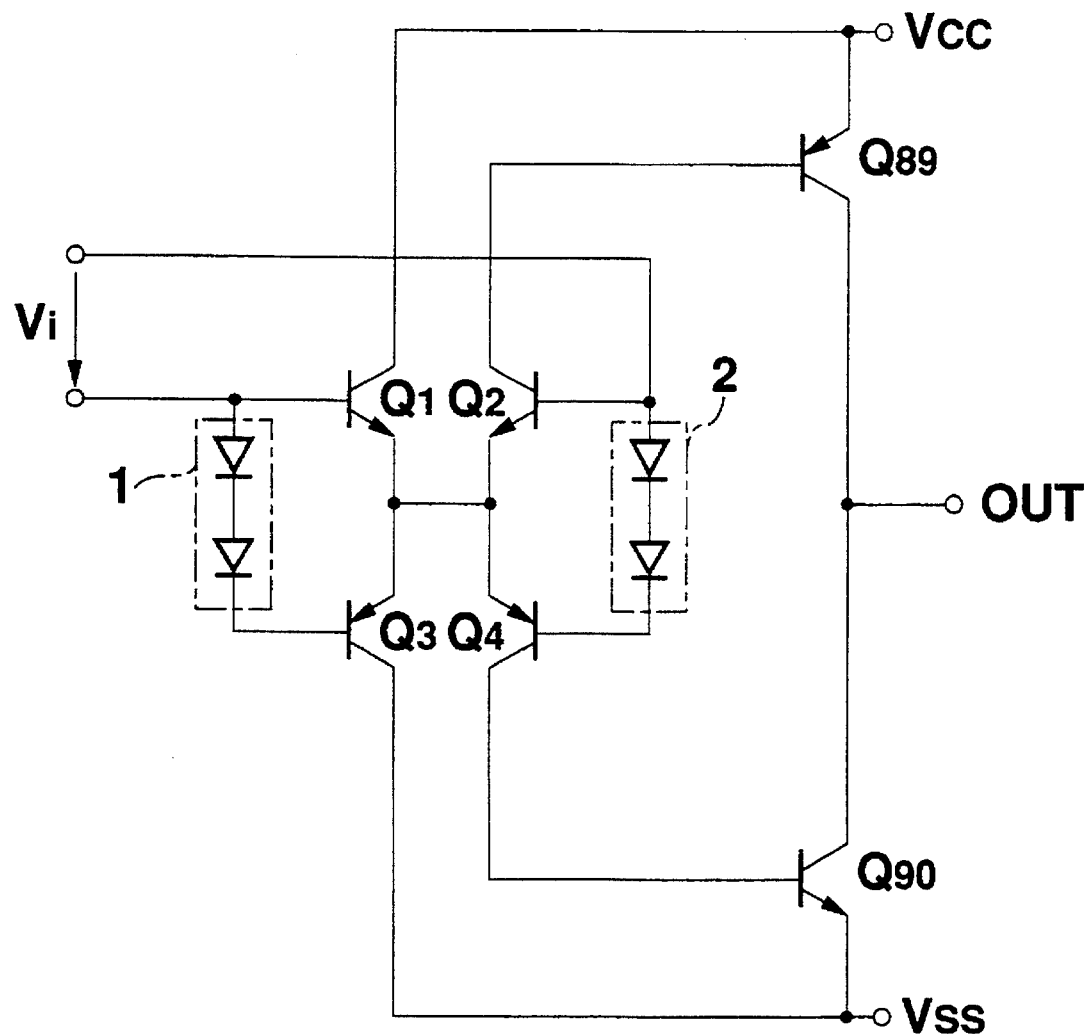
FIG. 19 is a circuit diagram showing another output circuit.
Figure 20:
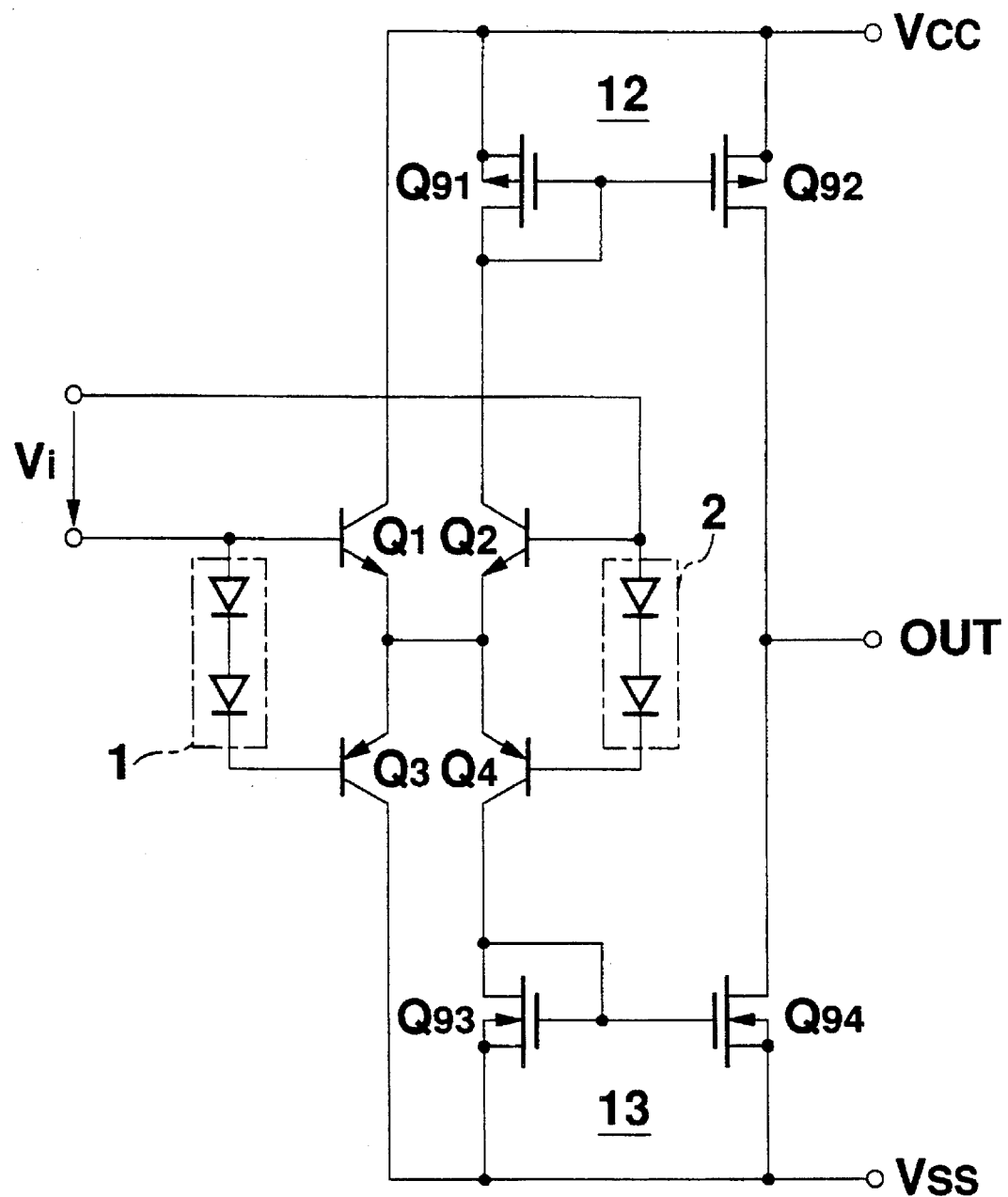
FIG. 20 is a circuit diagram showing still another output circuit.

As shown in FIG. 19, for example, the bases of output transistors $Q_{89}$ and $Q_{90}$ may be driven by the collectors of the transistors $Q_2$ and $Q_4$. In such a case, the collector currents of the transistor $Q_2$ and $Q_4$ are inversely amplified and thus obtained currents flow through the collectors of the transistors $Q_{89}$ and $Q_{90}$. Namely, the current output characteristics within the inversely amplifying characteristics of the bipolar transistors $Q_{89}$ and $Q_{90}$ are obtained. Alternatively, the current mirror circuits 12 and 13 at the output stage may be comprised of FETs as shown in FIG. 20. In this figure, the transistors $Q_{91}$ and $Q_{92}$ which constitute the current mirror circuit 12 are PMOSFETs, respectively, while the transistors $Q_{93}$ and $Q_{94}$ which constitute the current mirror circuit 13 are NMOSFETs, respectively. The aforementioned advantages are also obtained by this circuit structure.

Figure 21:
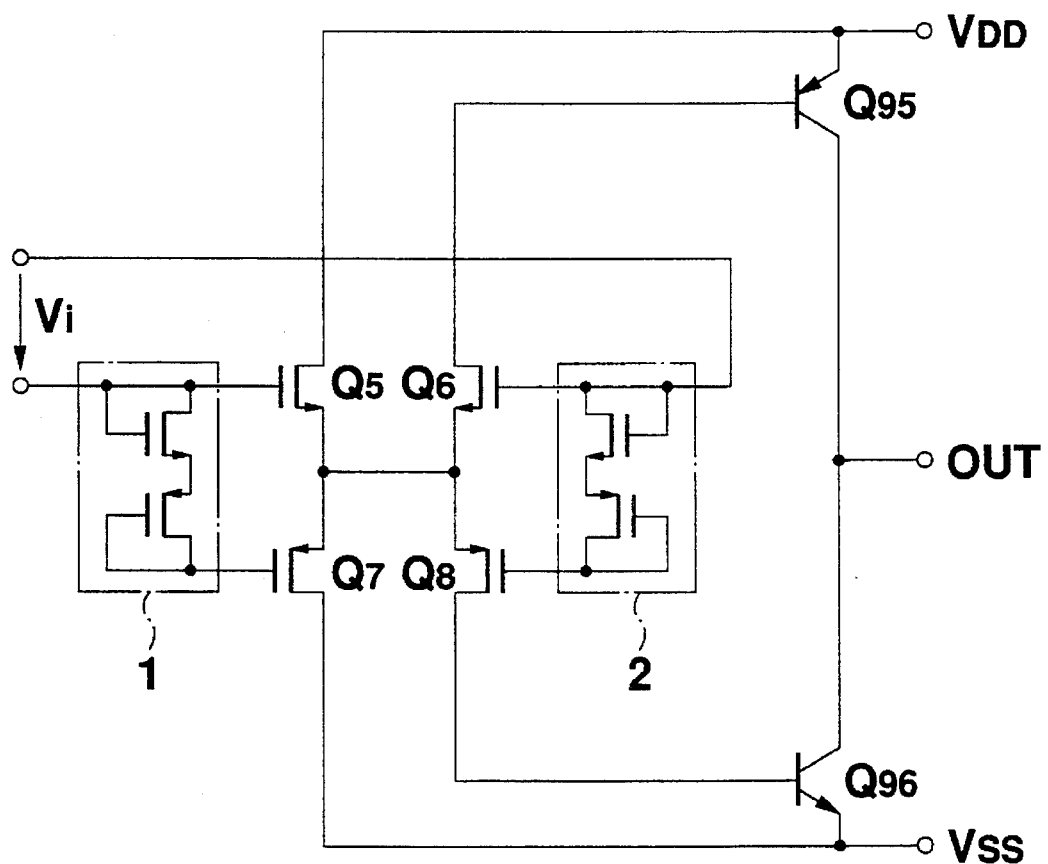
FIG. 21 is a circuit diagram showing a further output circuit.
Figure 22:
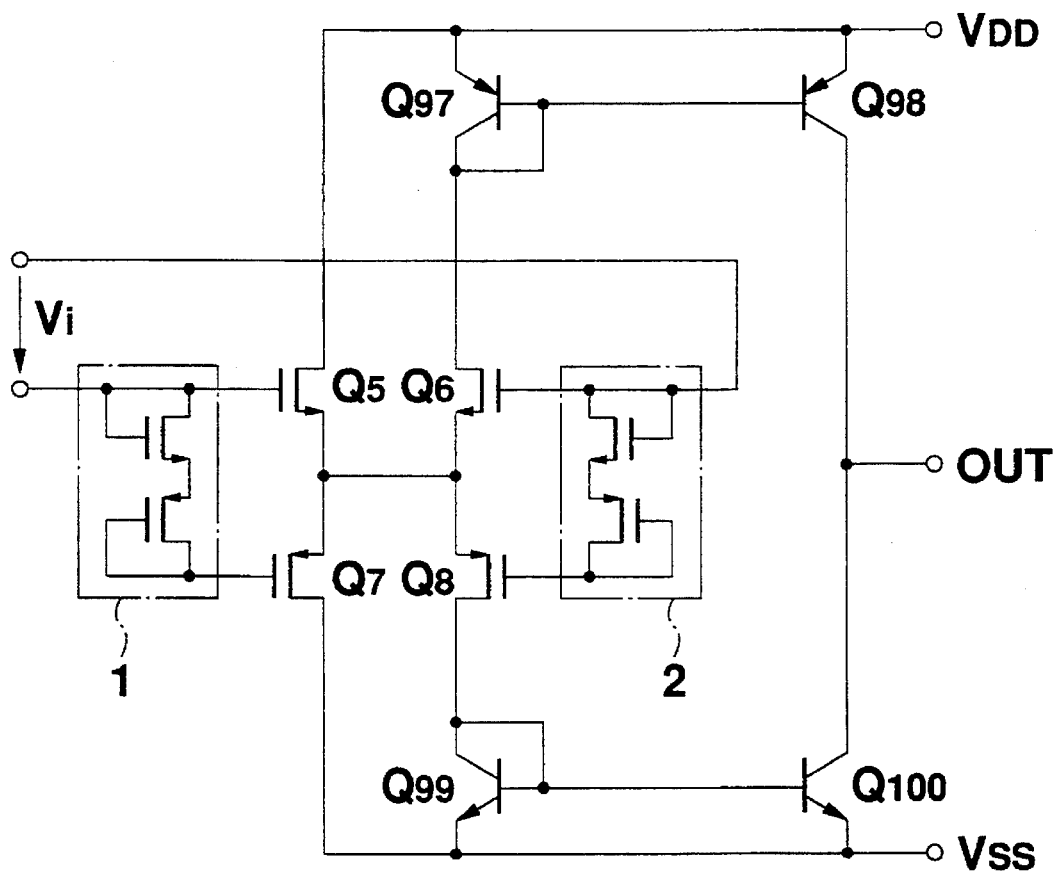
FIG. 22 is a circuit diagram showing a further output circuit.
Figure 23:
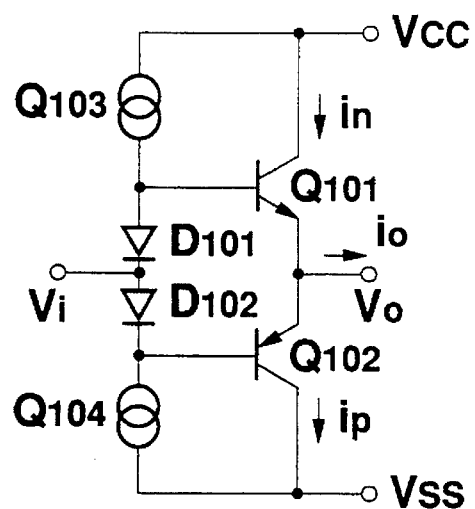
FIG. 23 is a circuit diagram showing a first circuit constructed in accordance with the prior art.
Figure 24:
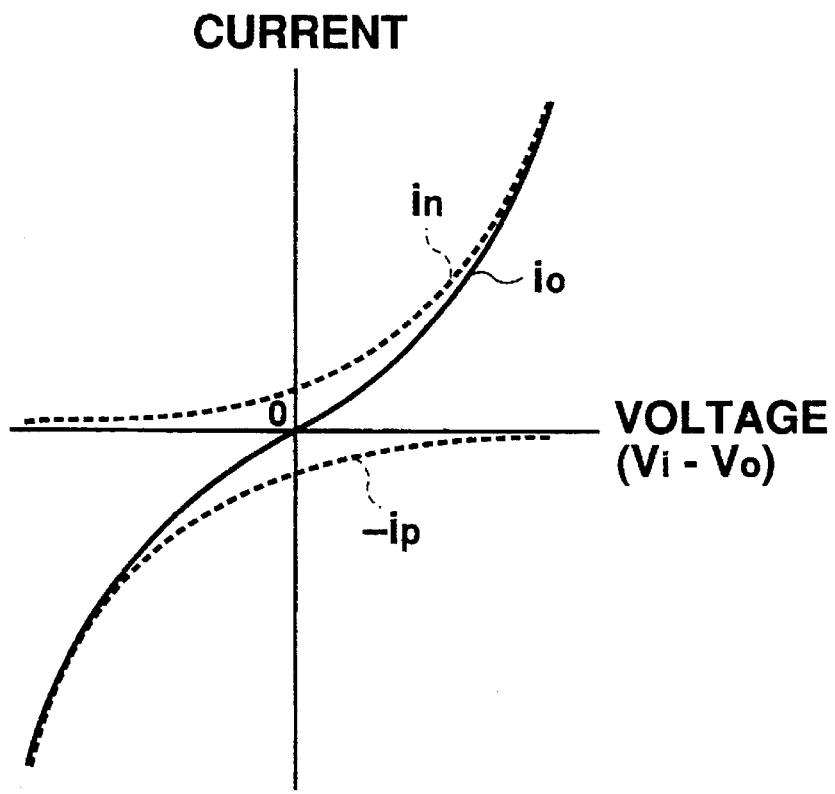
FIG. 24 is a view illustrating a class AB push-pull drive circuit constructed according to the prior art.
Figure 25:
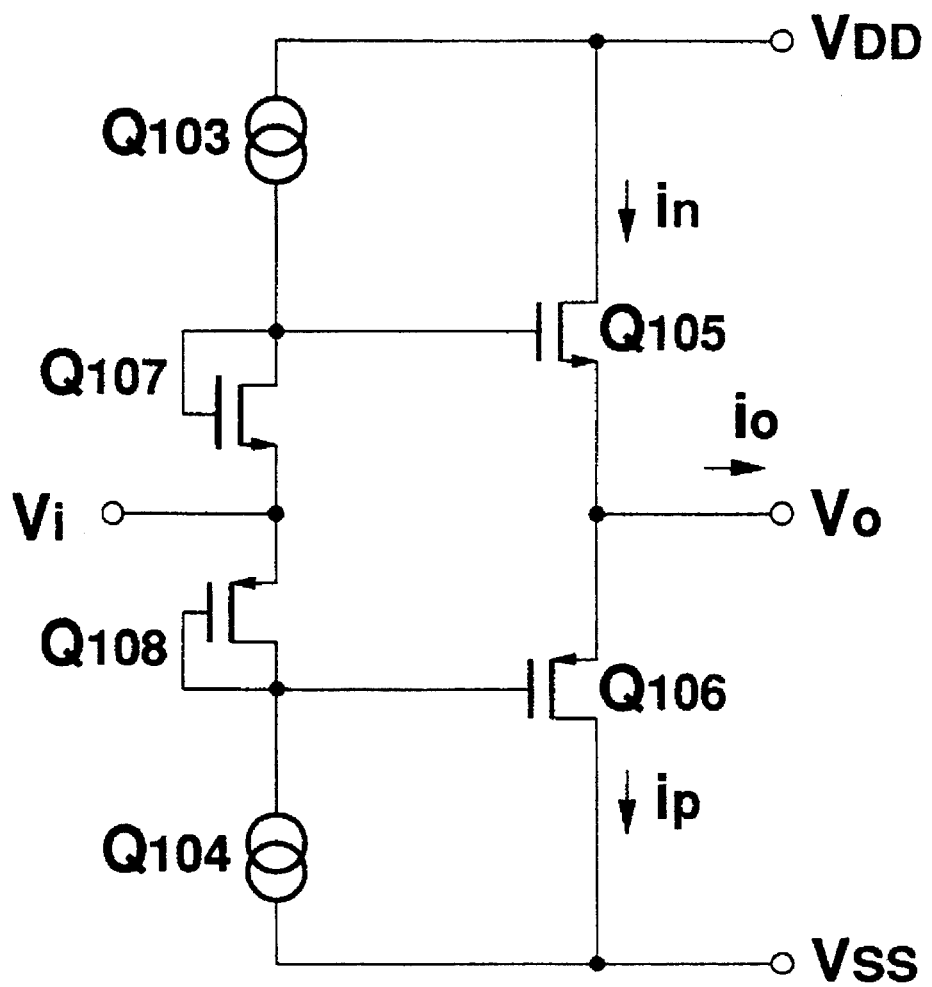
FIG. 25 is a circuit diagram showing a second circuit constructed in accordance with the prior art.
Figure 26:
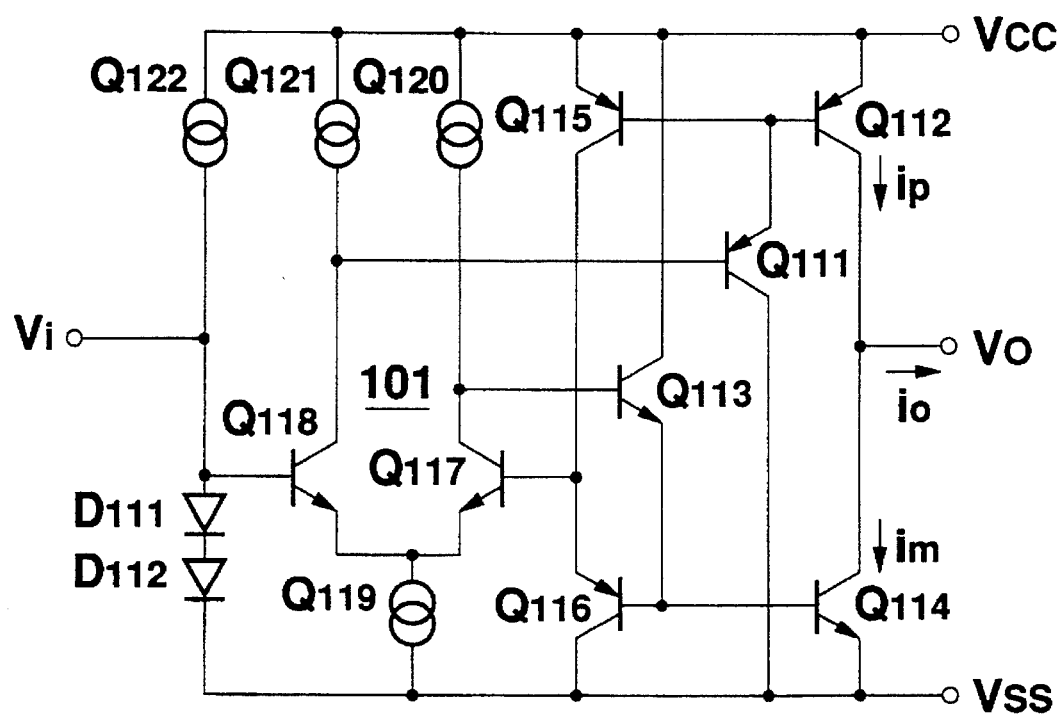
FIG. 26 is a circuit diagram showing a third circuit constructed in accordance with the prior art.

As shown in FIG. 21, for example, the bases of output transistors $Q_{95}$ and $Q_{96}$ may be driven by the drains of the FETs $Q_6$ and $Q_8$. In such a case, the drain currents of the FETs $Q_6$ and $Q_8$ are inversely amplified and thus obtained currents flow through the collectors of the transistors $Q_{95}$ and $Q_{96}$. Namely, the current output characteristics within the inversely amplifying characteristics of the transistors $Q_{95}$ and $Q_{96}$ are obtained. Alternatively, as shown in FIG. 22, the current mirror circuits 12 and 13 at the output stage may be comprised of bipolar transistors. In this figure, the transistors $Q_{97}$ and $Q_{98}$ which constitute the current mirror circuit 12 are PNP transistors, respectively, while the transistors $Q_{99}$ and $Q_{100}$ which constitute the current mirror circuit 13 are NPN transistors, respectively. The aforementioned advantages are also obtained by this circuit structure.

h) Advantages

As described, the class AB push-pull drive circuit of the present invention comprises first to fourth semiconductor elements having their supply electrodes connected together, the voltages between the control electrodes of the first and third semiconductor elements and between the control electrodes of the second and fourth semiconductor elements being maintained constant. Therefore, a current obtained by inverting and adding the drive electrode currents of the first and third semiconductor elements or the drive electrode currents of the second and fourth semiconductor elements becomes a class AB drive current. The class AB push-pull drive circuit does not require any loop for class AB drive. Therefore, an abnormal oscillation will not be produced and a difference between signal amplification paths can be reduced to make the circuit more stable. Where each of the first and second constant voltage circuits for holding the constant voltages is formed by two P-N junctions connected in series with each other, the temperature characteristics of each of the semiconductor elements can be compensated to stabilize the class AB push-pull drive circuit with respect to temperature.

Where an electronic circuit such as operational amplifier is formed by a class AB push-pull drive circuit constructed according to the present invention, current mirror circuits are used as output circuits. If the mirror ratio is increased, a load can be driven by a relatively large current in the class AB drive manner. When the class AB push-pull drive circuit is so constructed that the second constant voltage circuit is actuated by an intermediate voltage between the positive and negative supply voltages as a reference and that the first constant voltage circuit is actuated by a differential input voltage, the post-stage load can be driven in the class AB drive manner even if a difference between the positive and negative voltages is relatively low. In other words, the class AB push-pull drive circuit can be actuated by a relatively low voltage.

We claim:

1. A class AB push-pull drive circuit comprising:

first to fourth semiconductor elements each having a supply electrode, a drive electrode and a control electrode, the first and second semiconductor elements having a first polarity and the third and fourth semiconductor elements having a second polarity, the supply electrodes of the first to fourth semiconductor elements being connected together, through which a current substantially equal to that of the supply electrode flowing through each of the drive electrodes, the current flowing in each of the drive electrodes being controlled by the corresponding one of the control electrodes;

a first constant voltage circuit for maintaining the voltage between the control electrodes of the first and third semiconductor elements constant;

a second constant voltage circuit for maintaining the voltage between the control electrodes of the second and fourth semiconductor elements constant;

a first output circuit for inverting and adding the currents flowing in the drive electrodes of the first and third semiconductor elements to generate a class AB drive current which is in turn outputted therefrom; and a second output circuit for inverting and adding the currents flowing in the drive electrodes of the second and fourth semiconductor elements to generate another class AB drive current which is in turn outputted therefrom.

2. A class AB push-pull drive circuit as defined in claim 1 wherein said first output circuit comprises:

a first current mirror circuit for outputting a current being a mirror ratio times as large as the current in the drive electrode of the first semiconductor element; and a third current mirror circuit for outputting a current being a mirror ratio times as large as the current in the drive electrode of the third semiconductor element; and wherein the first and third current mirror circuits are connected to each other such that their output currents will be inverted and added to form the class AB drive current.

3. A class AB push-pull drive circuit as defined in claim 1 wherein said second output circuit comprises a second current mirror circuit for outputting a current being a mirror ratio times as large as the current in the drive electrode of the second semiconductor element; and a fourth current mirror circuit for outputting a current being mirror ratio times as larger as the current in the drive electrode of the fourth semiconductor element; and wherein the second and fourth current mirror circuits are connected to each other such that their output currents will be inverted and added to form another class AB drive current.

4. A class AB push-pull drive circuit as defined in claim 1 wherein said first to fourth semiconductor elements are bipolar transistors, the first and second polarities being respectively NPN junction and PNP junction and wherein the supply, drive and control electrodes are emitter, collector and base, respectively.

5. A class AB push-pull drive circuit as defined in claim 1 wherein said first to fourth semiconductor elements are field-effect transistors, the first and second polarities respectively being N-channel and P-channel types and wherein the supply, drive and control electrodes are source, drain and gate, respectively.

6. A class AB push-pull drive circuit as defined in claim 1 wherein the first constant voltage circuit includes first temperature characteristic compensating means for compensating the temperature-to-voltage characteristics of the first and third semiconductor elements and wherein the second constant voltage circuit includes second temperature characteristic compensating means for compensating the temperature-to-voltage characteristics of the second and fourth semiconductor elements.

7. A class AB push-pull drive circuit as defined in claim 6 wherein the first temperature characteristic compensating means comprises a first temperature compensating element having its temperature-to-voltage characteristics substantially equal to those of the first semiconductor element and a third temperature compensating element forwardly connected in series with said first temperature compensating element and having its temperature-to-voltage characteristics substantially equal to those of the third semiconductor element and wherein the second temperature characteristic compensating means comprises a second temperature compensating element having its temperature-to-voltage characteristics substantially equal to those of the second semiconductor element and a fourth temperature compensating element forwardly connected in series with said second temperature compensating element and having its temperature-to-voltage characteristics substantially equal to those of the fourth semiconductor element, a series connection between the first and third temperature compensating elements being forwardly connected in parallel to the first and third semiconductor elements and the series connection between a second and fourth temperature compensating elements being forwardly connected in parallel to the second and fourth semiconductor elements.

8. A class AB push-pull drive circuit as defined in claim 7 wherein the first to fourth temperature compensating elements are forwardly biased P-N junctions each having its temperature-to-voltage characteristics substantially equal to those of the corresponding one of said first to fourth semiconductor elements and wherein the first and second temperature characteristic compensating means each includes a first constant current source for biasing corresponding two of the first to fourth temperature compensating elements in the forward biased direction.

9. A class AB push-pull drive circuit as defined in claim 8 wherein the first to fourth semiconductor elements are bipolar transistors and wherein said P-N junction is a P-N junction between the base and emitter of a bipolar transistor which is short-circuited between the collector and base thereof.

10. A class AB push-pull drive circuit as defined in claim 8 wherein the first to fourth semiconductor elements are bipolar transistors and wherein the first and second temperature characteristic compensating means each includes a bipolar biasing transistor the base of which is driven by the first constant current source, said forwardly biased P-N junctions being P-N junctions between the base and emitter of bipolar transistors the bases of which are driven by corresponding bipolar biasing transistors.

11. A class AB push-pull drive circuit as defined in claim 8 wherein the first to fourth semiconductor elements are bipolar transistors and wherein the first and second temperature characteristic compensating means each includes a second constant current source, each of said forwardly biased P-N junctions being a P-N junction between the base and emitter of corresponding one of the bipolar transistors the base of which is driven by the second constant current source.

12. A class AB push-pull drive circuit as defined in claim 7 wherein the first to fourth temperature compensating elements are field-effect transistors, each of said field-effect transistors having its temperature-to-voltage characteristics substantially equal to those of the first to fourth semiconductor elements and being short-circuited between gate and drain thereof and wherein the first and second temperature characteristic compensating means each include a first constant current source for biasing corresponding two of the first to fourth temperature compensating elements in the forward biased direction.

13. A class AB push-pull drive circuit as defined in claim 7 wherein the first to fourth temperature compensating elements are field-effect transistors, each of said field-effect transistors having its temperature-to-voltage characteristics substantially equal to those of the first to fourth semiconductor elements and being short-circuited between gate and drain thereof and wherein the first and second temperature characteristic compensating means each includes a first constant current source for biasing corresponding two of the first to fourth temperature compensating elements in the forward biased direction and a second constant current source for driving the gates of corresponding two of the first to fourth temperature compensating elements.

14. A class AB push-pull drive circuit as defined in claim 1 wherein a differential input voltage is applied directly between the control electrodes of the first and second semiconductor elements and wherein another differential input voltage is applied between the control electrodes of the third and fourth semiconductor elements through the first and second constant voltage circuits.

15. A class AB push-pull drive circuit as defined in claim 1 wherein a differential input voltage is applied directly between the control electrodes of the third and fourth semiconductor elements and wherein another differential input voltage is applied between the control electrodes of the first and second semiconductor elements through the first and second constant voltage circuits.

16. A class AB push-pull drive circuit as defined in claim 1 wherein a differential input voltage is applied between the control electrodes of the first and second semiconductor elements through parts of the first and second constant voltage circuits and wherein another differential input voltage is applied between the control electrodes of the third and fourth semiconductor elements through the other parts of the first and second constant voltage circuits.

17. A class AB push-pull drive circuit as defined in claim 1, further comprising a differential input circuit responsive to a differential input voltage to generate a differential current which is in turn supplied to the first and second constant voltage circuits and wherein the first and second constant voltage circuits are responsive to the differential current to execute the constant voltage maintaining function.

18. A class AB push-pull drive circuit as defined in claim 1, further comprising:
   a first differential input circuit driven by a constant current and being responsive to a differential input voltage to output a first differential current; and
   a second differential input circuit driven by said constant current and being responsive to the differential input voltage to output a second differential current and wherein the first constant voltage circuit is directly or indirectly supplied with the first and second differential currents to execute the constant voltage maintaining function and the second constant voltage circuit being responsive to an intermediate voltage between positive and negative supply voltages as a reference to execute the constant voltage maintaining function.

19. A class AB push-pull drive circuit comprising:
   first to fourth semiconductor elements, the first and second semiconductor elements receiving a differential input signal, each of the first to fourth semiconductor elements having a supply electrode, a drive electrode and a control electrode, the first and second semiconductor elements having a first polarity and the third and fourth semiconductor elements having a second polarity, the supply electrodes of the first to fourth semiconductor elements being connected together, a current substantially equal to that of the supply electrode flowing through each of the drive electrodes, the current flowing in each of the drive electrodes being controlled by the corresponding one of the control electrodes;
   a first constant voltage circuit for maintaining the voltage between the control electrodes of the first and third semiconductor elements constant;
   a second constant voltage circuit for maintaining the voltage between the control electrodes of the second and fourth semiconductor elements constant; and
   a first output circuit for inverting and adding the currents flowing in the drive electrodes of the first and third semiconductor elements to generate a class AB drive current which is in turn outputted therefrom.

* * * * *